United States Patent
Zhao et al.

(10) Patent No.: US 10,529,868 B2
(45) Date of Patent: Jan. 7, 2020

(54) SOLAR CELL ARRAY, SOLAR CELL MODULE AND MANUFACTURING METHOD THEREOF

(71) Applicant: BYD COMPANY LIMITED, Shenzhen (CN)

(72) Inventors: Zhiqiang Zhao, Shenzhen (CN); Zhanfeng Jiang, Shenzhen (CN); Long He, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days.

(21) Appl. No.: 14/738,409

(22) Filed: Jun. 12, 2015

(65) Prior Publication Data
US 2016/0126362 A1 May 5, 2016

(30) Foreign Application Priority Data

Oct. 31, 2014 (CN) .......................... 2014 1 0606601
Oct. 31, 2014 (CN) .......................... 2014 1 0606607
(Continued)

(51) Int. Cl.
*H02N 6/00* (2006.01)
*H01L 31/042* (2014.01)
(Continued)

(52) U.S. Cl.
CPC .. *H01L 31/02013* (2013.01); *H01L 31/02008* (2013.01); *H01L 31/022433* (2013.01);
(Continued)

(58) Field of Classification Search
CPC ........... H01L 31/02008; H01L 31/0488; H01L 31/0508; H01L 31/0504; H01L 31/022433;
(Continued)

(56) References Cited

U.S. PATENT DOCUMENTS 3,620,847 A 11/1971 Wise
4,141,727 A 2/1979 Shida et al.
(Continued)

FOREIGN PATENT DOCUMENTS

CN 101919066 A 12/2010
CN 102217088 A 10/2011
(Continued)

OTHER PUBLICATIONS

PV Tech article via http://www.pv-tech.cn/technical_papers/The-front-electrode of crystalline silicon solar .../ dated Jul. 15, 2014, including English translation, (11p.).
Honsberg et al., "Series Resistance," accessed at http://web.archive.org/web/20121214003528/http://pveducation.org/pvcdrom/design/series-resistance>, published online as early as Dec. 14, 2012.
Braun, Stefan et al., "The Multi-Busbar Design: an Overview," 4th Metallization workshop, May 8, 2018, Konstanz, 30 pages.
Schindler, Sebastian, "Soldering Process and Material Characterization and Miniaturized Contact Structures of a Newly Developed Multi Busbar Cell Metallization Concept," 28th European Photovoltaic Solar Energy Conference and Exhibition, (2006), pp. 480-483.
(Continued)

*Primary Examiner* — Angelo Trivisonno
(74) *Attorney, Agent, or Firm* — Brinks Gilson & Lione

(57) ABSTRACT

A solar cell array comprises a plurality of cells, adjacent cells connected by a metal wire. At least one metal wire extends reciprocally between a surface of a first cell and a surface of a second cell adjacent to the first cell to form a plurality of conductive wires. The number of the conductive wires is n, $y-y\times 20\% \leq n \leq y+y\times 20\%$, in which n is an integer and $y=4.0533X^{-1.28}/156^2 \ast A \ast B$, in which X is a diameter value of the metal wire with mm as a unit, $0.1 \leq X \leq 0.5$, A and B representing length and width of the cell with mm as the unit. The cells comprise secondary grid lines disposed on front surfaces thereof. The conductive wires are welded with the secondary grid lines by a welding layer.

19 Claims, 6 Drawing Sheets

(30) Foreign Application Priority Data

| Date | | |
|---|---|---|
| Oct. 31, 2014 | (CN) | 2014 1 0606675 |
| Oct. 31, 2014 | (CN) | 2014 1 0606700 |
| Oct. 31, 2014 | (CN) | 2014 1 0608469 |
| Oct. 31, 2014 | (CN) | 2014 1 0608576 |
| Oct. 31, 2014 | (CN) | 2014 1 0608577 |
| Oct. 31, 2014 | (CN) | 2014 1 0608579 |
| Oct. 31, 2014 | (CN) | 2014 1 0608580 |
| Feb. 17, 2015 | (CN) | 2015 1 0085666 |
| Apr. 30, 2015 | (CN) | 2015 1 0217551 |
| Apr. 30, 2015 | (CN) | 2015 1 0217573 |
| Apr. 30, 2015 | (CN) | 2015 1 0217609 |
| Apr. 30, 2015 | (CN) | 2015 1 0217616 |
| Apr. 30, 2015 | (CN) | 2015 1 0217617 |
| Apr. 30, 2015 | (CN) | 2015 1 0217625 |
| Apr. 30, 2015 | (CN) | 2015 1 0217687 |
| Apr. 30, 2015 | (CN) | 2015 1 0218489 |
| Apr. 30, 2015 | (CN) | 2015 1 0218535 |
| Apr. 30, 2015 | (CN) | 2015 1 0218562 |
| Apr. 30, 2015 | (CN) | 2015 1 0218563 |
| Apr. 30, 2015 | (CN) | 2015 1 0218574 |
| Apr. 30, 2015 | (CN) | 2015 1 0218635 |
| Apr. 30, 2015 | (CN) | 2015 1 0218697 |
| Apr. 30, 2015 | (CN) | 2015 1 0219182 |
| Apr. 30, 2015 | (CN) | 2015 1 0219353 |
| Apr. 30, 2015 | (CN) | 2015 1 0219366 |
| Apr. 30, 2015 | (CN) | 2015 1 0219378 |
| Apr. 30, 2015 | (CN) | 2015 1 0219417 |
| Apr. 30, 2015 | (CN) | 2015 1 0219436 |
| Apr. 30, 2015 | (CN) | 2015 1 0219540 |
| Apr. 30, 2015 | (CN) | 2015 1 0219565 |
| Apr. 30, 2015 | (CN) | 2015 1 0221302 |
| Apr. 30, 2015 | (CN) | 2015 2 0276309 |
| Apr. 30, 2015 | (CN) | 2015 2 0276534 |
| Apr. 30, 2015 | (CN) | 2015 2 0277480 |
| Apr. 30, 2015 | (CN) | 2015 2 0278149 |
| Apr. 30, 2015 | (CN) | 2015 2 0278183 |
| Apr. 30, 2015 | (CN) | 2015 2 0278409 |
| Apr. 30, 2015 | (CN) | 2015 2 0280778 |
| Apr. 30, 2015 | (CN) | 2015 2 0280868 |

(51) Int. Cl.
*H01L 31/02* (2006.01)
*H01L 31/048* (2014.01)
*H01L 31/05* (2014.01)
*H01L 31/0224* (2006.01)
*H01L 31/18* (2006.01)
*H01L 31/049* (2014.01)

(52) U.S. Cl.
CPC .......... *H01L 31/048* (2013.01); *H01L 31/049* (2014.12); *H01L 31/0488* (2013.01); *H01L 31/0504* (2013.01); *H01L 31/0508* (2013.01); *H01L 31/18* (2013.01); *Y02E 10/50* (2013.01)

(58) Field of Classification Search
CPC .. H01L 31/18; H01L 31/048; H01L 31/02013
USPC ........................................................ 136/244
See application file for complete search history.

(56) References Cited

U.S. PATENT DOCUMENTS

| | | | |
|---|---|---|---|
| 4,287,382 A | 9/1981 | French | |
| 4,336,648 A | 6/1982 | Pschunder et al. | |
| 4,574,160 A | 3/1986 | Cull et al. | |
| 4,633,034 A | 12/1986 | Nath et al. | |
| 5,011,544 A | 4/1991 | Gaddy et al. | |
| 5,380,371 A | 1/1995 | Murakami | |
| 5,620,528 A * | 4/1997 | Schade | H01L 31/022425 136/244 |
| 5,942,048 A | 8/1999 | Fujisaki et al. | |
| 6,021,099 A * | 2/2000 | Aoki | G04B 19/12 368/205 |
| 6,710,239 B2 * | 3/2004 | Tanaka | H01L 31/022425 136/244 |
| 6,870,087 B1 | 3/2005 | Gallagher | |
| 7,432,438 B2 | 10/2008 | Rubin et al. | |
| 7,534,956 B2 | 5/2009 | Kataoka et al. | |
| 8,356,640 B1 | 1/2013 | Nizenkoff et al. | |
| 2002/0148499 A1 | 10/2002 | Tanaka | |
| 2004/0084078 A1 | 5/2004 | Yoshida et al. | |
| 2004/0182432 A1 | 9/2004 | Yoda et al. | |
| 2005/0268959 A1 | 12/2005 | Aschenbrenner et al. | |
| 2006/0283496 A1 | 12/2006 | Okamoto et al. | |
| 2007/0095387 A1 | 5/2007 | Fuji et al. | |
| 2007/0186968 A1 | 8/2007 | Nakauchi et al. | |
| 2007/0209697 A1 | 9/2007 | Karakida et al. | |
| 2008/0083453 A1 | 4/2008 | Rose et al. | |
| 2008/0149161 A1 | 6/2008 | Nishida et al. | |
| 2009/0038679 A1 | 2/2009 | Varghese et al. | |
| 2009/0111206 A1 | 4/2009 | Luch | |
| 2009/0120490 A1 * | 5/2009 | Huang | C03C 3/068 136/252 |
| 2009/0173385 A1 | 7/2009 | Kost et al. | |
| 2009/0242013 A1 | 10/2009 | Taguchi | |
| 2009/0283137 A1 | 11/2009 | Croft et al. | |
| 2010/0000602 A1 | 1/2010 | Gray et al. | |
| 2010/0043863 A1 * | 2/2010 | Wudu | H01L 31/0504 136/244 |
| 2010/0043871 A1 | 2/2010 | Xia et al. | |
| 2010/0055822 A1 | 3/2010 | Weidman et al. | |
| 2010/0065116 A1 | 3/2010 | Stancel et al. | |
| 2010/0089447 A1 * | 4/2010 | Basol | H01L 31/022425 136/256 |
| 2010/0139753 A1 | 6/2010 | Repmann et al. | |
| 2010/0275976 A1 * | 11/2010 | Rubin | H01L 31/02008 136/251 |
| 2011/0023958 A1 | 2/2011 | Masson et al. | |
| 2011/0036390 A1 | 2/2011 | Nelson et al. | |
| 2011/0048492 A1 | 3/2011 | Nishiwaki | |
| 2011/0290298 A1 | 12/2011 | Krause et al. | |
| 2012/0060894 A1 | 3/2012 | Nakauchi et al. | |
| 2012/0125393 A1 | 5/2012 | Austin | |
| 2012/0138141 A1 | 6/2012 | Kim et al. | |
| 2012/0192932 A1 | 8/2012 | Wu et al. | |
| 2012/0234379 A1 | 9/2012 | Takenaka | |
| 2012/0253541 A1 | 10/2012 | Arditi et al. | |
| 2013/0074902 A1 * | 3/2013 | Taira | H01L 31/022433 136/244 |
| 2013/0269748 A1 | 10/2013 | Wiedeman et al. | |
| 2014/0048752 A1 | 2/2014 | Akimoto | |
| 2014/0182651 A1 | 7/2014 | Rogerson et al. | |
| 2016/0005905 A1 | 1/2016 | Jang et al. | |

FOREIGN PATENT DOCUMENTS

| | | | |
|---|---|---|---|
| CN | 102237425 A | 11/2011 | |
| CN | 202434543 U | 9/2012 | |
| CN | 202678326 U | 1/2013 | |
| CN | 202721137 U | 2/2013 | |
| CN | 202839628 U | 3/2013 | |
| CN | 203221719 U | 10/2013 | |
| CN | 103489931 A | 1/2014 | |
| CN | 203746873 U | 7/2014 | |
| CN | 104037265 A | 9/2014 | |
| CN | 203932074 U | 11/2014 | |
| CN | 204243052 U | 4/2015 | |
| CN | 104752556 A * | 7/2015 | ......... H01L 31/0216 |
| JP | 1986085876 A | 9/1984 | |
| JP | 2004146464 A | 5/2004 | |
| JP | 2004288677 A | 10/2004 | |
| JP | 2005191319 A | 7/2005 | |
| JP | 2011009392 A | 1/2011 | |
| JP | 2012028806 A | 2/2012 | |

(56) References Cited

FOREIGN PATENT DOCUMENTS

| JP | 2012509588 A | 4/2012 | |
|---|---|---|---|
| JP | 2013058747 A | 3/2013 | |
| JP | 2013065588 A | 4/2013 | |
| JP | 2014103301 A | 6/2014 | |
| WO | WO 2008/138950 | 11/2008 | |
| WO | WO 2014/045909 A1 | 3/2014 | |
| WO | WO 2015101252 A1 * | 7/2015 | ..... H01L 31/022425 |

OTHER PUBLICATIONS

Stietka, Michael et al., "*Wire Cell: A More Efficient Silicon Solar Cell and Module,*" European Photovoltaic Solar Energy Conference, Valencia, Spain, Sep. 2008, as paper ICV.2.33, pp. 1-5.

Walter, Johann et al., "*Multi-Wire Interconnection of Busbar-Free Solar Cells,*" ScienceDirect, Energy Procedia vol. 55, (2014), pp. 380-388.

\* cited by examiner

SOLAR CELL ARRAY, SOLAR CELL MODULE AND MANUFACTURING METHOD THEREOF

The present application claims priority to the following 41 Chinese applications, the entireties of all of which are hereby incorporated by reference.
1. Chinese Patent Application No. 201410608576.6, filed Oct. 31, 2014;
2. Chinese Patent Application No. 201410606607.4, filed Oct. 31, 2014;
3. Chinese Patent Application No. 201410606601.7, filed Oct. 31, 2014;
4. Chinese Patent Application No. 201410606675.0, filed Oct. 31, 2014;
5. Chinese Patent Application No. 201410608579.X, filed Oct. 31, 2014;
6. Chinese Patent Application No. 201410608577.0, filed Oct. 31, 2014;
7. Chinese Patent Application No. 201410608580.2, filed Oct. 31, 2014;
8. Chinese Patent Application No. 201410606700.5, filed Oct. 31, 2014;
9. Chinese Patent Application No. 201410608469.3, filed Oct. 31, 2014;
10. Chinese Patent Application No. 201510085666.6, filed Feb. 17, 2015;
11. Chinese Patent Application No. 201510217625.8, filed Apr. 30, 2015;
12. Chinese Patent Application No. 201510217609.9, filed Apr. 30, 2015;
13. Chinese Patent Application No. 201520276309.3, filed Apr. 30, 2015;
14. Chinese Patent Application No. 201510217687.9, filed Apr. 30, 2015;
15. Chinese Patent Application No. 201510219182.6, filed Apr. 30, 2015;
16. Chinese Patent Application No. 201510217617.3, filed Apr. 30, 2015;
17. Chinese Patent Application No. 201520278183.3, filed Apr. 30, 2015;
18. Chinese Patent Application No. 201510217573.4, filed Apr. 30, 2015;
19. Chinese Patent Application No. 201510219540.3, filed Apr. 30, 2015;
20. Chinese Patent Application No. 201510218489.4, filed Apr. 30, 2015;
21. Chinese Patent Application No. 201510218563.2, filed Apr. 30, 2015;
22. Chinese Patent Application No. 201510219565.3, filed Apr. 30, 2015;
23. Chinese Patent Application No. 201510219436.4, filed Apr. 30, 2015;
24. Chinese Patent Application No. 201510218635.3, filed Apr. 30, 2015;
25. Chinese Patent Application No. 201520277480.6, filed Apr. 30, 2015;
26. Chinese Patent Application No. 201510219366.2, filed Apr. 30, 2015;
27. Chinese Patent Application No. 201520278409.X, filed Apr. 30, 2015;
28. Chinese Patent Application No. 201510218697.4, filed Apr. 30, 2015;
29. Chinese Patent Application No. 201510219417.1, filed Apr. 30, 2015;
30. Chinese Patent Application No. 201510221302.6, filed Apr. 30, 2015;
31. Chinese Patent Application No. 201510219353.5, filed Apr. 30, 2015;
32. Chinese Patent Application No. 201520280778.2, filed Apr. 30, 2015;
33. Chinese Patent Application No. 201510219378.5, filed Apr. 30, 2015;
34. Chinese Patent Application No. 201520280868.1, filed Apr. 30, 2015;
35. Chinese Patent Application No. 201510218574.0, filed Apr. 30, 2015;
36. Chinese Patent Application No. 201510217616.9, filed Apr. 30, 2015;
37. Chinese Patent Application No. 201520278149.6, filed Apr. 30, 2015;
38. Chinese Patent Application No. 201510218562.8, filed Apr. 30, 2015;
39. Chinese Patent Application No. 201510218535.0, filed Apr. 30, 2015;
40. Chinese Patent Application No. 201510217551.8, filed Apr. 30, 2015; and
41. Chinese Patent Application No. 201520276534.7, filed Apr. 30, 2015.

The present application is relevant to the following 10 U.S. applications, filed concurrently with the present application, the entireties of which are hereby incorporated by reference.

U.S. patent application Ser. No. 14/738,244, entitled "Solar Cell Module And Manufacturing Method Thereof," filed Jun. 12, 2015;

U.S. patent application Ser. No. 14/738,322, entitled "Solar Cell Array, Solar Cell Module And Manufacturing Method Thereof," filed Jun. 12, 2015;

U.S. patent application Ser. No. 14/738,368, entitled "Solar Cell Array, Solar Cell Module And Manufacturing Method Thereof," filed Jun. 12, 2015;

U.S. patent application Ser. No. 14/738,390, entitled "Solar Cell Module And Manufacturing Method Thereof," filed Jun. 12, 2015;

U.S. patent application Ser. No. 14/738,677, entitled "Solar Cell Unit, Solar Cell Array, Solar Cell Module And Manufacturing Method Thereof," filed Jun. 12, 2015;

U.S. patent application Ser. No. 14/738,664, entitled "Solar Cell Unit, Solar Cell Array, Solar Cell Module And Manufacturing Method Thereof," filed Jun. 12, 2015;

U.S. patent application Ser. No. 14/738,516, entitled "Solar Cell Unit, Solar Cell Array, Solar Cell Module And Manufacturing Method Thereof," filed Jun. 12, 2015;

U.S. patent application Ser. No. 14/738,578, entitled "Solar Cell Unit, Solar Cell Array, Solar Cell Module And Manufacturing Method Thereof," filed Jun. 12, 2015;

U.S. patent application Ser. No. 14/738,587, entitled "Solar Cell Unit, Solar Cell Array, Solar Cell Module And Manufacturing Method Thereof," filed Jun. 12, 2015; and U.S. patent application Ser. No. 14/738,637, entitled "Method For Manufacturing Solar Cell Module," filed Jun. 12, 2015.

FIELD

The present disclosure relates to the field of solar cells, and more particularly, to solar cell arrays, solar cell modules and manufacturing methods thereof.

BACKGROUND

A solar cell module is one of the most important components of a solar power generation device. Sunlight irradiates to a cell from its front surface and is converted to electricity within the cell. Primary grid lines and secondary grid lines disposed on the front surface cover part of the front surface of the cell, and then the part of sunlight irradiating to the primary grid lines and the secondary grid lines cannot be converted into electric energy. Thus, the primary grid lines and the secondary grid lines need to be as fine as possible in order for the solar cell module to receive more sunlight. However, the primary grid lines and the secondary grid lines serve to conduct current, and in terms of resistivity, the finer the primary grid lines and the secondary grid lines are, the smaller the cross section area thereof is, which causes greater loss of electricity due to increased resistivity. Therefore, the primary grid lines and the secondary grid lines must be designed to achieve a balance between light blocking and electric conduction, and to take the cost into consideration.

SUMMARY

In one aspect, a solar cell array comprises a plurality of cells, adjacent cells connected by a metal wire. At least one metal wire extends reciprocally between a surface of a first cell and a surface of a second cell adjacent to the first cell to form a plurality of conductive wires. The number of the conductive wires is n, $y-y\times 20\% \leq n \leq y+y\times 20\%$, in which n is an integer and $y=4.0533 X^{-1.28}/156^2 * A * B$, in which X is a diameter value of the metal wire with mm as a unit, $0.1 \leq X \leq 0.5$, A and B representing length and width of the cell with mm as the unit. The cells comprise secondary grid lines disposed on front surfaces thereof. The conductive wires are welded with the secondary grid lines by a welding layer.

In another aspect, a solar cell array comprises a plurality of cells. Adjacent cells are connected by a metal wire. At least one metal wire extends reciprocally between a surface of a first cell and a surface of a second cell adjacent to the first cell to form a plurality of conductive wires. The relationship between the number of the conductive wires on the cell whose length and width are 156 mm respectively and the diameter of the metal wire is shown in the table recited in the claim. The cells comprise secondary grid lines disposed on front surfaces thereof. The conductive wires are welded with the secondary grid lines by a welding layer.

REFERENCE NUMERALS

Figure 1:
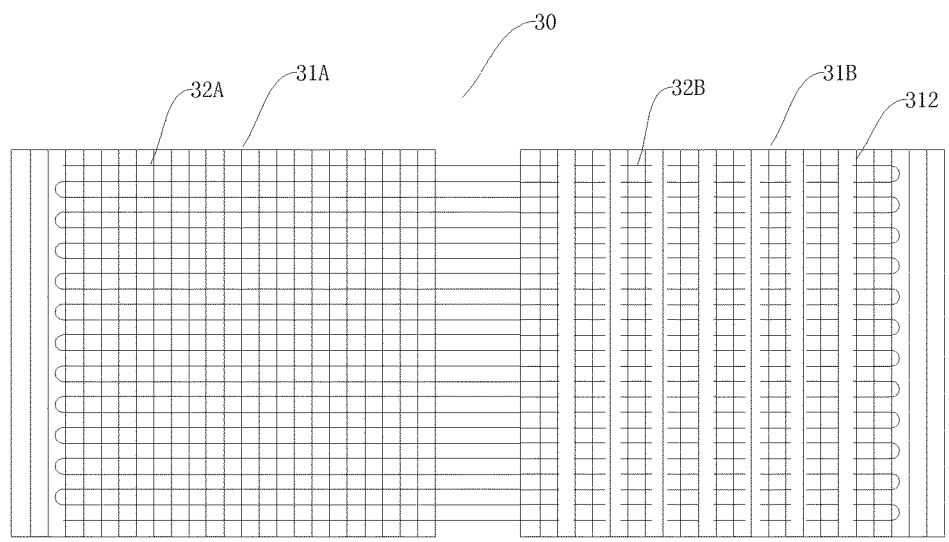
FIG. 1 is a plan view of a solar cell array according to an embodiment of the present disclosure.

100 cell module
10 upper cover plate
20 front adhesive layer
30 cell array
31 cell
31A first cell
31B second cell
311 cell substrate
312 secondary grid line
312A front secondary grid line
312B back secondary grid line
313 back electric field
314 back electrode
32 conductive wire
32A front conductive wire
32B back conductive wire
321 metal wire body
322 welding layer
33 short grid line
34 clip
40 back adhesive layer
50 lower cover plate

DETAILED DESCRIPTION

Embodiments of the present disclosure will be described in detail and examples of the embodiments will be illustrated in the drawings, where same or similar reference numerals are used to indicate same or similar members or members with same or similar functions. The embodiments described herein with reference to the drawings are explanatory, which are used to illustrate the present disclosure, but shall not be construed to limit the present disclosure.

In prior art, the front surface of the solar cell is usually provided with the primary grid lines and the secondary grid lines to output the current generated by the photoelectric effect or chemistry effect. In order to improve the efficiency of the solar cells, solar cell manufacturers conducted extensive researches on how to increase the number of the primary grid lines. In prior art, the number of primary grid lines has been successfully increased from two to three, or even five.

However, in prior art, the primary grid lines and the secondary grid lines of the solar cells are made of expensive silver paste, which requires a complicated and costly manufacturing process of the primary grid lines and the secondary grid lines. When the cells are connected into a module, the primary grid lines on the front surface of a cell are welded with back electrodes of another adjacent cell by a solder strip. Consequently, the welding of the primary grid lines is complicated, and the manufacturing cost of the cells is high.

In prior art, two primary grid lines are usually disposed on the front surface of the cell, and formed by applying silver paste to the front surface of the cell. The primary grid lines have a great width (for example, up to over 2 mm), which consumes a large amount of silver, and makes the cost high.

In prior art, a solar cell with three primary grid lines is provided, but still consumes a large amount of silver, and has a high cost. Moreover, three primary grid lines increase the shaded area, which reduces the photoelectric conversion efficiency.

In addition, the number of the primary grid lines is limited by the solder strip. The larger the number of the primary grid lines is, the finer a single primary grid line is, and hence the solder strip needs to be narrower. Therefore, it is more difficult to weld the primary grid lines with the solder strip and to produce the narrower solder strip, and thus the cost of the welding rises.

Consequently, from the perspective of lowering the cost and reducing the shaded area, in prior art, the silver primary grid lines printed on the cell are replaced with metal wires, for example, copper wires. The copper wires are welded with the secondary grid lines to output the current. Since the silver primary grid lines are no longer used, the cost can be reduced considerably. The copper wire has a smaller diameter to reduce the shaded area, so the number of the copper wires can be raised up to 10. This kind of cell may be called a cell without primary grid lines, in which the metal wire replaces the silver primary grid lines and solder strips in the traditional solar cells.

After extensive research, the inventors of the present disclosure finds if a cell is manufacture in a way that multiple parallel metal wires are drawn simultaneously, cut off, and then welded to the cell simultaneously, due to limitations of sophistication of equipment and process, for example, the influence of stress, the solar cell is bent to some extent when disposed at a free state, so the metal wire needs to remain strained to flatten the cell (a test proves that the minimum strain is at least 2 N for a copper wire with a diameter of 0.2 mm) In order to keep the strain, each metal wire needs to be provided with clips or similar equipment at the two ends thereof, and the equipment occupies certain space, but the space in the cell is limited. Thus, in prior art, at most ten metal wires can be drawn, fixed and welded to a single cell, and it will be difficult to increase the number of the metal wires. The larger the number of the metal wires is, the more free ends there are, such that the equipment needs to control more metal wires at the same time, which is demanding as for the wiredrawing equipment. Moreover, the space of the solar cells is limited. For example, the dimension of a single cell is 156 mm×156 mm. In such limited space, the multiple metal wires need to be controlled accurately at the same time, which is demanding as for the equipment, especially as for the accuracy. Currently, it is still difficult to control and weld multiple metal wires simultaneously in actual production, so the number of the conductive wires is limited, usually at most about ten, which is difficult to realize.

In order to solve the above problem, relevant patents (US20100275976 and US20100043863) provide a technical solution that multiple metal wires are fixed on a transparent film. That's to say, multiple parallel metal wires are fixed on the transparent film by adhesion; then, the transparent film bound with the multiple parallel metal wires is attached to the cell; finally the metal wires contact with the secondary grid lines on the cell by lamination. By this method, the multiple metal wires are fixed via the transparent film, which solves the problem of controlling the multiple metal wires simultaneously, and further increases the number of the metal wires. However, the technical solution almost abandons the welding process. That's to say, the metal wires are not connected with the secondary grid lines by the welding process; instead, the metal wires contact with the secondary grid lines by the laminating process, so as to output the current.

The above technical solution can further increase the number of the metal wires, but the transparent film may affect the light absorption, which causes certain degree of shading, and thus lowers the photoelectric conversion efficiency.

Furthermore, the above technical solution cannot connect the metal wires with the secondary grid lines by the welding process, because the melting temperature of the transparent film must be higher than the welding temperature (usually around 140° C.). Otherwise the transparent film will melt in the process of welding, which may lose the function of fixing the metal wires, and then the metal wires drift, resulting in poor welding effects.

Moreover, it is known to those skilled in the art that the solar cells in use are sealed to prevent moisture and air from penetrating the cells, which may cause corrosion and short circuits. The encapsulating material at present is EVA whose melting point is 70° C. to 80° C., much lower than the welding temperature. If the welding process is employed, as said above, the melting temperature of the transparent film must be higher than the welding temperature, which is higher than the melting point of the encapsulating material. Thus, in the encapsulating process, the encapsulating material (EVA) will melt at the encapsulating temperature, but the transparent film will not, such that the melting encapsulating material cannot penetrate the solid transparent film to completely seal the cells. Hence, the sealing effect is poor, and the actual product tends to fail. In terms of encapsulating, the melting temperature of the transparent film needs to be lower than the welding temperature, which is an evident paradox.

Therefore, the technical solution of fixing the metal wires via the transparent film cannot adopt the welding process to weld the metal wires with the secondary grid lines. The metal wires are merely in contact with the secondary grid lines on the cells, i.e. the metal wires are only placed on the secondary grid lines. Thus, the connection strength of the metal wires and the secondary grid lines is so low that the metal wires tend to separate from the secondary grid lines in the laminating process or in use, which causes bad contact, low efficiency of the cells, or even failure thereof. Consequently, the product in this technical solution is not promoted and commercialized. There is no relatively mature solar cell without primary grid lines.

The present disclosure seeks to solve at least one of the problems existing in the related art to at least some extent.

The present disclosure provides a solar cell without primary grid lines, and the number of the conductive wires disposed the cell can be increased up to 20 or even greater. In the present disclosure, the conductive wires are constituted by a few metal wires which extend reciprocally, so as to reduce the free ends. Consequently, the number of the metal wires is not limited by the space, and more conductive wires may be disposed on the cell to facilitate the welding between the multiple conductive wires and the secondary grid lines on the cell. Meanwhile, in the solar cell without primary grid lines of the present disclosure, the conductive wires and the secondary grid lines are connected by welding, which is reliable and simple to manufacture, and has good sealability and high efficiency. Thus, the solar cells satisfy the practical requirements and may be commercialized for mass production.

Specifically, the present disclosure provides a solar cell array that is easy to manufacture in low cost, and has high photoelectric conversion efficiency.

The present disclosure further provides a solar cell module having the above solar cell array. The solar cell module is easy to manufacture in low cost, and improves the photoelectric conversion efficiency.

The present disclosure further provides a method for manufacturing the solar cell module.

According to a first aspect of embodiments of the present disclosure, a solar cell array includes a plurality of cells, adjacent cells connected by a metal wire, at least one metal wire extending reciprocally between a surface of a first cell and a surface of a second cell adjacent to the first cell to form a plurality of conductive wires, the number of the conductive wires being n, $y-y\times 20\% \leq n \leq y+y\times 20\%$, in which n is an integer and $y=4.0533X^{-1.28}/156^2*A*B$, in which X is a diameter value of the metal wire with mm as a unit, $0.1 \leq X \leq 0.5$, A and B representing length and width of the cell with mm as the unit; the cells being provided with secondary grid lines on front surfaces thereof, and the conductive wires being welded with the secondary grid lines by a welding layer.

In the solar cell array according to embodiments of the present disclosure, the conductive wires are constituted by the metal wire which extends reciprocally. The metal wire extends reciprocally between two adjacent cells in a winding way to form a folded shape. The conductive wires of this structure are easy to manufacture in low cost, and can improve the photoelectric conversion efficiency of the solar cell array.

The conductive wires are arranged in a winding way to avoid failure of the whole conductive wires when a single conductive wire breaks off or is insufficiently welded, so as to avoid instability of the cells. The conductive wires and the secondary grid lines are welded, such that the conductive wires in the solar cell module will not drift and be insufficiently welded, and the solar cell module obtains relatively high photoelectric conversion efficiency.

Figure 14:
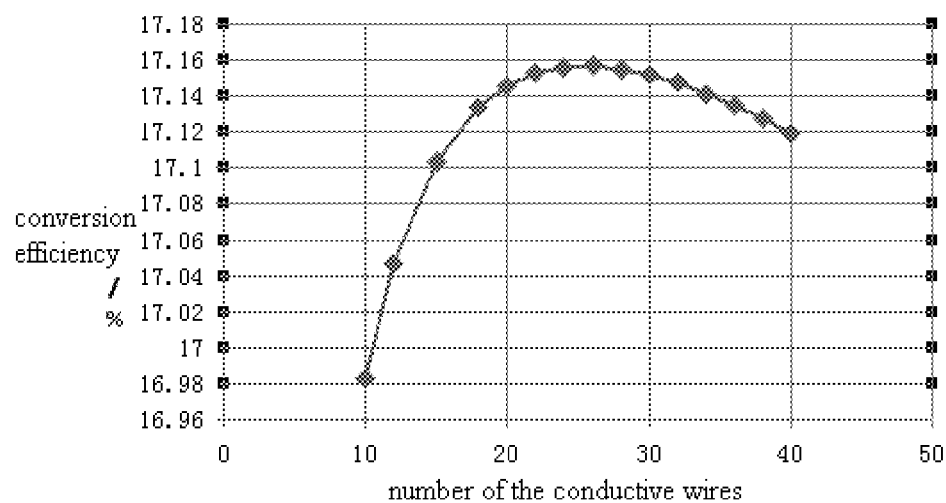
FIG. 14 is a curve graph of relationship between the number of conductive wires and photoelectric conversion efficiency in a solar cell array according to embodiments of the present disclosure.

After extensive research, the inventor of the present disclosure finds out the method in the present disclosure can manufacture a suitable number of conductive wires, and obtain a solar cell with optimal performance. As for the factors such as process, equipment, etc. in the practical operation, the optimal numbers of the conductive wires corresponding to different wire diameters are obtained respectively through numerous tests, and as shown in FIG. 14, when the metal wire has a diameter of 0.25 mm, 20 to 30 conductive wires can achieve the optimal photoelectric conversion efficiency.

The present disclosure further provides a solar cell array, comprising a plurality of cells, adjacent cells connected by a metal wire, at least one metal wire extending reciprocally between a surface of a first cell and a surface of a second cell adjacent to the first cell to form a plurality of conductive wires, in which the relationship between the number of the conductive wires on the cell whose length and width are 156 mm respectively and the diameter of the metal wire is shown in Table 1; the cells being provided with secondary grid lines on front surfaces thereof, and the conductive wires being welded with the secondary grid lines by a welding layer.

TABLE 1

| | Diameter of metal wire (mm) | | | | | |
|---|---|---|---|---|---|---|
| | 0.1 | 0.12 | 0.14 | 0.16 | 0.18 | 0.2 |
| Number of metal wire | 65-79 | 54-66 | 46-56 | 40-48 | 34-42 | 30-36 |
| | Diameter of metal wire (mm) | | | | | |
| | 0.26 | 0.28 | 0.3 | 0.32 | 0.34 | 0.36 |
| Number of metal wire | 21-25 | 18-22 | 16-20 | 15-19 | 14-18 | 14-17 |

According to a second aspect of embodiments of the present disclosure, the solar cell module includes an upper cover plate, a front adhesive layer, a cell array, a back adhesive layer and a back plate superposed in sequence, the cell array being the above solar cell array.

According to a third aspect of embodiments of the present disclosure, a method for manufacturing a solar cell module includes: forming at least two conductive wires by a metal wire that extends reciprocally a surface of a first cell of and a surface of a second cell adjacent to the first cell, welding the conductive wires with a secondary grid line on a front surface of the cell, such that the adjacent cells are connected by the conductive wires to constitute the above cell array; superposing an upper cover plate, a front adhesive layer, the cell array, a back adhesive layer and a back plate in sequence, in which a front surface of the cell faces the front adhesive layer, a back surface thereof facing the back adhesive layer, and laminating them to obtain the solar cell module.

The winding method in the present disclosure facilitates electrical connection of the metal wire with the cell, and the good connection performance is beneficial, especially, to welding of the metal wire with the cell, and can avoid insufficient welding of the conductive wires. The solar cell manufactured has beautiful design and good performance. Moreover, a suitable number of conductive wires can be manufactured, as long as they are strained by two clips, which is independent from space limit. The process is easy to realize with simple equipment, which can be industrialized.

Part of technical terms in the present disclosure will be elaborated herein for clarity and convenience of description.

According to one embodiment of the present disclosure, referring to FIGS. 1-12, cell 31 includes a cell substrate 311, secondary grid lines 312 disposed on a front surface (the surface on which light is incident) of the cell substrate 311, a back electric field 313 disposed on a back surface of the cell substrate 311, and back electrodes 314 disposed on the back electric field 313. Thus, the secondary grid lines 312 can be called the secondary grid lines 312 of the cell 31, the back electric field 313 called the back electric field 313 of the cell 31, and the back electrodes 314 called the back electrodes 314 of the cell 31. In one implementation, the secondary grid lines comprise an edge secondary grid line adjacent to an edge of the first cell, the edge secondary grid line comprises at least one welding portion and at least one non-welding portion. Each instance of the at least one welding portion has a length longer than each instance of the at least one non-welding portion, and the length of the at least one welding portion and the length of the at least one non-welding portion are parallel to a longitudinal direction of the edge secondary grid line. This implementation is disclosed in U.S. patent application Ser. No. 14/738,587, which is incorporated by reference in its entirety.

The cell substrate 311 can be an intermediate product obtained by subjecting, for example, a silicon chip to processes of felting, diffusing, edge etching and silicon nitride layer depositing. However, it shall be understood that the cell substrate 311 in the present disclosure is not limited to be formed by the silicon chip.

In other words, the cell 31 comprises a silicon chip, some processing layers on a surface of the silicon chip, secondary grid lines on a front surface, and a back electric field 313 and back electrodes 314 on a back surface, or includes other equivalent solar cells of other types without any front electrode.

Cell unit includes a cell 31 and conductive wires 32 constituted by a metal wire S.

A solar cell array 30 includes a plurality of cells 31 and conductive wires 32 which connect adjacent cells 31 and are constituted by the metal wire S. In other words, the solar cell array 30 is formed of a plurality of cells 31 connected by the conductive wires 32.

In the solar cell array 30, the metal wire S constitutes the conductive wires 32 of the cell unit, and extends between surfaces of the adjacent cells 31, which shall be understood in a broad sense that the metal wire S may extend between front surfaces of the adjacent cells 31, or may extend between a front surface of a first cell 31 and a back surface of a second cell 31 adjacent to the first cell 31. When the metal wire S extends between the front surface of the first cell 31 and the back surface of the second cell 31 adjacent to the first cell 31, the conductive wires 32 may include front conductive wires 32A extending on the front surface of the cell 31 and electrically connected with the secondary grid lines 312 of the cell 31, and back conductive wires 32B extending on the back surface of the cell 31 and electrically connected with the back electrodes 314 of the cell 31. Part of the metal wire S between the adjacent cells 31 can be called connection conductive wires.

In the present disclosure, the cell substrate 311, the cell 31, the cell unit, the cell array 30 and the solar cell module are only for the convenience of description, and shall not be construed to limit the present disclosure.

All the ranges disclosed in the present disclosure include endpoints, and can be individual or combined. It shall be understood that the endpoints and any value of the ranges are not limited to an accurate range or value, but also include values proximate the ranges or values.

In the present disclosure, orientation terms such as "upper" and "lower" usually refer to the orientation "upper" or "lower" as shown in the drawings under discussion, unless specified otherwise; "front surface" refers to a surface of the solar cell module facing the light when the module is in operation, i.e. a surface on which light is incident, while "back surface" refers to a surface of the solar cell module back to the light when the module is in operation.

In the following, the solar cell array 30 will be described according to the embodiments of the present disclosure.

As shown in FIG. 1 to FIG. 12, the solar cell array 30 according to the embodiments of the present disclosure includes a plurality of cells 31, adjacent cells 31 connected by a metal wire, at least one metal wire extending reciprocally between a surface of a first cell 31 and a surface of a second cell 31 adjacent to the first cell 31 to form a plurality of conductive wires 32, the number of the conductive wires being n, $y-y \times 20\% \leq n \leq y+y \times 20\%$, in which n is an integer and $y=4.0533X^{-1.28}/156^2 *A*B$, in which X is a diameter value of the metal wire with mm as a unit, $0.1 \leq X \leq 0.5$, A and B representing length and width of the cell with mm as the unit; the cells are provided with secondary grid lines on front surfaces thereof, and the conductive wires are welded with the secondary grid lines by a welding layer.

In other words, the solar cell array 30 according to the embodiments of the present disclosure comprises at least two cells 31, and the adjacent cells 31 are connected by a plurality of conductive wires 32. At least two conductive wires 32 are constituted by a metal wire extending reciprocally between two adjacent cells 31. The cell 31 is provided with secondary grid lines 312, and the metal wire which extends reciprocally between the two adjacent cells 31 is welded with the secondary grid lines 312.

The number of the conductive wires 32 is n, in which n is an integer, and its range is $y-y \times 20\% \leq n \leq y+y \times 20\%$, and $y=4.0533X^{-1.28}/156^2 *A*B$, in which X represents a diameter value of the metal wire with mm as a unit, $0.1 \leq X \leq 0.5$, A and B representing length and width of the cell with mm as the unit.

That's to say, when the length and width of the cell 31 is, for example, 156 mm respectively, $y=4.0533X^{-1.28}$. If $X=0.1$, then $y=77.234$. N ranges from 61.787 to 92.681, and since n is an integer, n ranges from 62 to 92, i.e. the number of the conductive wires ranging from 62 to 92.

Preferably, $y-y \times 10\% \leq n \leq y+y \times 10\%$, $0.1 \text{ mm} \leq X \text{ mm} \leq 0.4 \text{ mm}$, further preferably, $y-y \times 5\% \leq n \leq y+y \times 5\%$.

As for the same cell, the number of the conductive wires corresponding to the metal wire of different diameters to obtain the optimal performance of the cell is different. After extensive research, the inventors of the present disclosure find that the method in the present disclosure can manufacture a suitable number of conductive wires, and obtain a solar cell with optimal performance. As for the factors such as process, equipment, etc. in the practical operation, the optimal numbers of the conductive wires corresponding to different wire diameters are obtained respectively through numerous tests, and as shown in FIG. 14, when the metal wire has a diameter of 0.25 mm, 20 to 30 conductive wires can achieve the optimal photoelectric conversion efficiency.

The present disclosure further provides a solar cell array, comprising a plurality of cells, adjacent cells connected by a metal wire, at least one metal wire extending reciprocally between a surface of a first cell and a surface of a second cell adjacent to the first cell to form a plurality of conductive wires, in which the relationship between the number of the conductive wires on the cell of 156 mm×156 mm (i e the length and width are 156 mm respectively) and the diameter of the metal wire is shown in Table 1; the cells being provided with secondary grid lines on front surfaces thereof, and the conductive wires being welded with the secondary grid lines by a welding layer.

TABLE 1

| | Diameter of metal wire (mm) | | | | | |
|---|---|---|---|---|---|---|
| | 0.1 | 0.12 | 0.14 | 0.16 | 0.18 | 0.2 |
| Number of metal wire | 65-79 | 54-66 | 46-56 | 40-48 | 34-42 | 30-36 |
| | Diameter of metal wire (mm) | | | | | |
| | 0.26 | 0.28 | 0.3 | 0.32 | 0.34 | 0.36 |
| Number of metal wire | 21-25 | 18-22 | 16-20 | 15-19 | 14-18 | 14-17 |

The present disclosure is not limited to that all the conductive wires are formed by winding the metal wire—the conductive wires can be partially or completely formed by winding the metal wire. The reciprocal extension can be back and forth once. There is no limit as to the termination point of the reciprocal extension—the starting point and the termination point can be at the same cell or at different cells, as long as the metal wire is winded.

The cell unit is formed by the cell 31 and the conductive wires 32 constituted by the metal wire S which extends on the surface of the cell 31. In other words, the solar cell array 30 according to the embodiments of the present disclosure is formed with a plurality of cell units; the conductive wires 32 of the plurality of cells are formed by the metal wire S which extends reciprocally between the surfaces of the cells 31.

It shall be understood that the term "extending reciprocally" in this disclosure can be called "winding" which means that the metal wire S extends between the surfaces of the cells 31. For example, referring to FIG. 1, in some circumstances, the metal wire extends between the surfaces of the cells 31 in the same plane, such as either between the front surfaces or between the bottom surfaces of the cells, to form a serpentine pattern. In some other circumstances, the metal wire S extends between the surfaces of the cells 31 in multiple planes, such as between both the front surface of a cell and the bottom surface of an adjacent cell, to form a serpentine pattern. In yet other circumstances, the metal wire S extends between the surfaces of the cells 31 both in the same plane and in multiple planes, such as sometimes between either the front surfaces or the bottom surfaces of some adjacent cells, and at other times between both the front surface of a certain cell and the bottom surface of an adjacent cell, to form a serpentine pattern. The plurality of conductive wires equals two or more passes of the serpentine shaped pattern. Preferably, two or more passes of the serpentine shaped pattern on the same plane are substantially parallel to each other. More preferably, all the passes of the serpentine shaped pattern on the same plane are substantially parallel to each other.

In the present disclosure, it shall be understood in a broad sense that "the metal wire S extends reciprocally between surfaces of the cells 31. For example, the metal wire S may extend reciprocally between a front surface of a first cell 31 and a back surface of a second cell 31 adjacent to the first cell 31; the metal wire S may extend from a surface of the first cell 31 through surfaces of a predetermined number of middle cells 31 to a surface of the last cell 31, and then extends back from the surface of the last cell 31 through the surfaces of a predetermined number of middle cells 31 to the surface of the first cell 31, extending reciprocally like this.

In addition, when the cells 31 are connected in parallel by the metal wire S, the metal wire S can extend on front surfaces of the cells, such that the metal wire S constitutes a front conductive wire 32A. Alternatively, a first metal wire S extends reciprocally between the front surfaces of the cells, and a second metal wire S extends reciprocally between the back surfaces of the cells, such that the first metal wire S constitutes a front conductive wire 32A, and the second metal wire S constitutes a back conductive wire 32B.

When the cells 31 are connected in series by the metal wire S, the metal wire S can extend reciprocally between a front surface of a first cell 31 and a back surface of a second cell 31 adjacent to the first cell 31, such that part of the metal wire S which extends on the front surface of the first cell 31 constitutes a front conductive wire 32A, and part thereof which extends on the back surface of the second cell 31 constitutes a back conductive wire 32B. In the present disclosure, unless specified otherwise, the conductive wire 32 can be understood as the front conductive wire 32A, the back conductive wire 32B, or the combination thereof.

The term "extending reciprocally" can be understood as that the metal wire S extends reciprocally once to form two conductive wires 32 which are formed by winding a metal wire S. For example, two adjacent conductive wires form a U-shape structure or a V-shape structure, yet the present disclosure is not limited to the above.

In the solar cell array 30 according to the embodiments of the present disclosure, the conductive wires 32 located on the cells 31 are constituted by the metal wire S which extends reciprocally; and the adjacent cells 31 are connected by the conductive wires 32. Hence, the cells are not necessarily printed with expensive silver paste on the surfaces thereof, and can be manufactured in a simple manner without using a solder strip to connect the cells. It is easy and convenient to connect the metal wire S with the secondary grid lines and the back electrodes, so that the cost of the cells is reduced considerably.

Moreover, since the conductive wires 32 are constituted by the metal wire S which extends reciprocally, the width of the conductive wires 32 (i.e. the width of projection of the metal wire on the cell) may be decreased, thereby decreasing the shaded area of the conductive wires 32. Further, the number of the conductive wires 32 can be adjusted easily, and thus the resistance of the conductive wires 32 is reduced, compared with the conductive wires made of the silver paste, and the efficiency of photoelectric conversion is improved. Since the metal wire S extends reciprocally to form the conductive wires, when the cell array 30 is used to manufacture the solar cell module 100, the metal wire S will not tend to shift, i.e. the metal wire is not easy to "drift", which will not affect but further improve the photoelectric conversion efficiency.

According to the solar cell array according to the embodiments of the present disclosure, since the conductive wires are constituted by the metal wire which extends reciprocally, the structure of the conductive wires that are arranged in a winding way between the adjacent cells 31 to extend reciprocally is a folded shape, which is easy to manufacture in low cost, and can improve the photoelectric conversion efficiency of the solar cell array. The conductive wires 32 are welded with the secondary grid lines 312, and the conductive wires 32 in the solar cell module will not drift and be insufficiently welded, so as to obtain a relatively high photoelectric conversion efficiency.

Therefore, the solar cell array 30 according to the embodiments of the present disclosure has low cost and high photoelectric conversion efficiency.

In the following, the solar cell array 30 according to specific embodiments of the present disclosure will be described with reference to the drawings.

The solar cell array 30 according to a specific embodiment of the present disclosure is illustrated with reference to FIG. 1 to FIG. 3.

Figure 2:
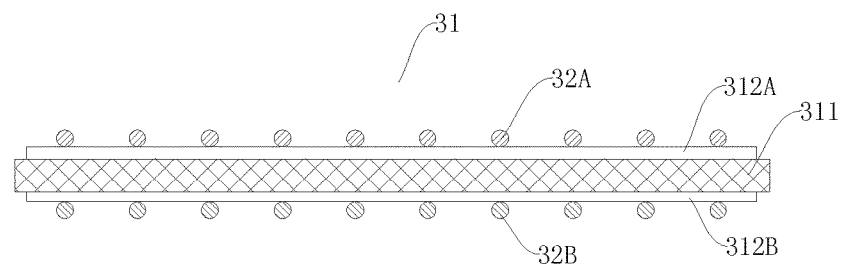
FIG. 2 is a sectional view of a solar cell array according to an embodiment of the present disclosure.
Figure 3:
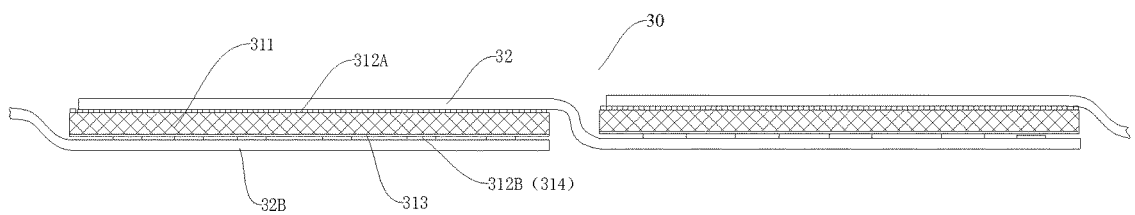
FIG. 3 is a sectional view of a solar cell array according to embodiments of the present disclosure.

In the embodiment shown in FIG. 1 to FIG. 3, two cells in the solar cell array 30 are shown. In other words, it shows two cells 31 connected with each other via the conductive wire 32 constituted by the metal wire S.

It can be understood that the cell 31 comprises a cell substrate 311, a secondary grid line 312 (a front secondary grid line 312A) disposed on a front surface of the cell substrate 311, a back electric field 313 disposed on a back surface of the cell substrate 311, and a back electrode 314 disposed on the back electric field 313. In the present disclosure, it can be understood that the back electrode 314 may be a back electrode of a traditional cell, for example, printed by the silver paste, or may be a back secondary grid line 312B similar to the secondary grid line on the front surface of the cell substrate, or may be multiple discrete welding portions, unless specified otherwise. The secondary grid line refers to the secondary grid line 312 on the front surface of the cell substrate 311, unless specified otherwise.

As shown in FIG. 1 to FIG. 3, the solar cell array in the embodiment includes two cells 31A, 31B (called a first cell 31A and a second cell 31B respectively for convenience of description). The metal wire S extends reciprocally between the front surface of the first cell 31A (a front surface, i.e. an upper surface in FIG. 2) and the back surface of the second cell 31B, such that the metal wire S constitutes a front conductive wire of the first cell 31A and a back conductive wire of the second cell 31B. The metal wire S is electrically connected with the secondary grid line of the first cell 31A and welded with the back electrode of the second cell 31B.

In an embodiment of the present disclosure, back electrodes 314 are disposed on the back surface of the cell substrate 311, and the metal wire is welded with the back electrodes 314.

That's to say, in the embodiment, front secondary grid lines 312A are disposed on the front surface of the cell substrate 311, and back electrodes 314 are disposed on the back surface of the cell substrate 311. When located on the back surface of the cell substrate 311, the conductive wires 32 are welded with the back electrodes 314 on the back surface of the cell substrate 311.

In some embodiments, the metal wire extends reciprocally between the first cell 31A and the second cell 31B for 10 to 60 times. Preferably, as shown in FIG. 1, the metal wire extends reciprocally for 12 times to form 24 conductive wires, and there is only one metal wire. In other words, a single metal wire extends reciprocally for 12 times to form 24 conductive wires, and the distance of the adjacent conductive wires can range from 2.5 mm to 15 mm. In this embodiment, the number of the conductive wires is increased, compared with the traditional cell, such that the distance between the secondary grid line and the conductive wire which the current runs through is decreased, so as to reduce the resistance and improve the photoelectric conversion efficiency. In the embodiment shown in FIG. 1, the adjacent conductive wires form a U-shape structure, for convenience of winding the metal wire. Alternatively, the present disclosure is not limited to the above. For example, the adjacent conductive wires may form a V-shape structure.

Figure 4:
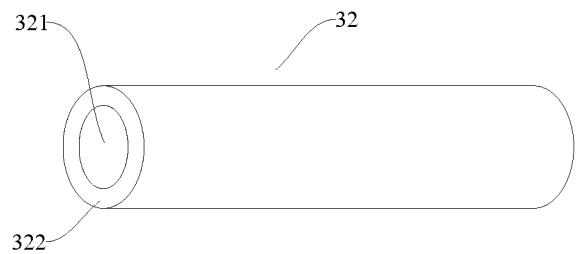
FIG. 4 is a schematic diagram of a metal wire for forming a conductive wire according to embodiments of the present disclosure.

More preferably, as shown in FIG. 4, the metal wire S includes a metal wire body 321 and a welding layer 322 coating the outer surface of the metal wire body. The metal wire is welded with the secondary grid lines and/or the back electrodes by the welding layer 322, such that it is convenient to electrically connect the metal with the secondary grid lines and/or the back electrodes, and to avoid drifting of the metal wire in the connection process so as to guarantee the photoelectric conversion efficiency. Of course, the electrical connection of the metal with the cell substrate can be conducted during or before the laminating process of the solar cell module, and preference is given to the latter.

It shall be noted that in the present disclosure, the metal wire S refers to a metal wire for extending reciprocally on the cells 31 to form the conductive wires 32; and the conductive wires 32 include a metal wire body 321 and a welding layer 322 coating the metal wire body 321, i.e. the metal wire S consists of the metal wire body 321 and the welding layer 322 coating the metal wire body 321. In the embodiments of the present disclosure, unless specified otherwise, the metal wire represents the metal wire S which extends reciprocally on the cells to form the conductive wires 32.

In some embodiments, preferably, the metal wire body 321 is a copper wire. Of course, the metal wire S can be a copper wire, too. In other words, the metal wire does not include the welding layer 322, but the present disclosure is not limited thereto. For example, the metal wire body 321 can be an aluminum wire. Preferably, the metal wire S has a circular cross section, such that more sunlight can reach the cell substrate to further improve the photoelectric conversion efficiency.

In some specific embodiments of the present disclosure, there may be a single metal wire or multiple metal wires. Specifically, the single metal wire is bent reciprocally for many times to form a plurality of conductive wire. When the metal wire has a diameter of 0.25 mm, the number of the conductive wires is 24 to 30, preferably 24 to 26, and the yield and the electric performance are the best.

In some embodiments, preferably, before the metal wire contact the cell, the metal wire extends under strain, i.e. straightening the metal wire. After the metal wire is connected with the secondary grid line and the back electrode of the cell, the strain of the metal wire can be released, so as to further avoid the drifting of the conductive wire when the solar cell module is manufacture, and to guarantee the photoelectric conversion efficiency.

Figure 5:
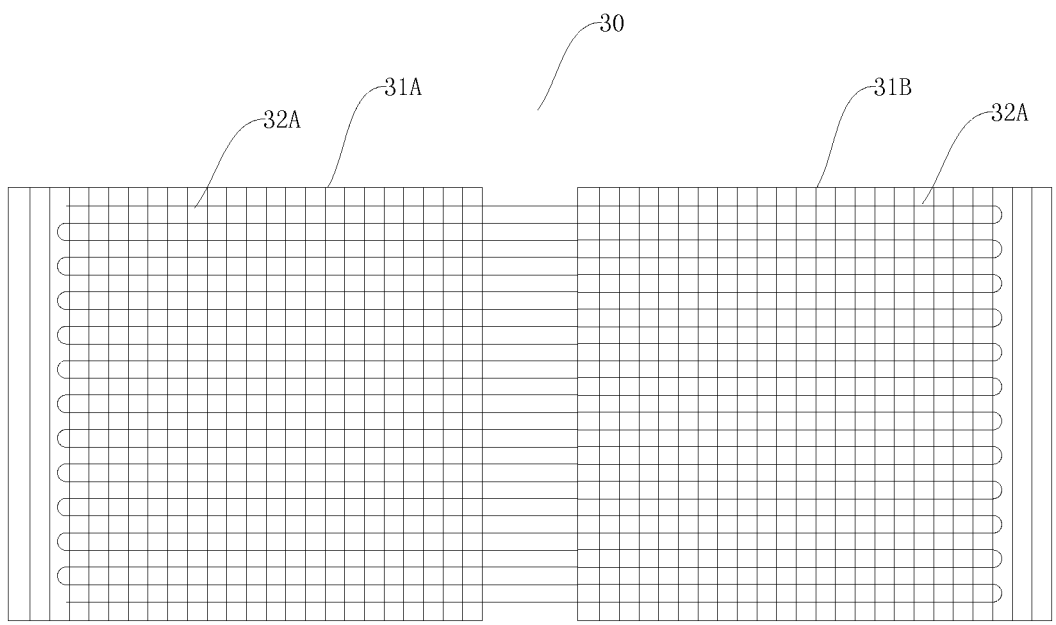
FIG. 5 is a plan view of a solar cell array according to another embodiment of the present disclosure.

FIG. 5 is a schematic diagram of a solar cell array according to another embodiment of the present disclosure. As shown in FIG. 5, the metal wire extends reciprocally between the front surface of the first cell 31A and the front surface of the second cell 31B, such that the metal wire constitutes a front conductive wire of the first cell 31A and a front conductive wire of the second cell 31B. In such a way, the first cell 31A and the second cell are connected in parallel. Of course, it can be understood that preferably the back electrode of the first cell 31A and the back electrode of the second cell 31B can be connected via a back conductive wire constituted by another metal wire which extends reciprocally. Alternatively, the back electrode of the first cell 31A and the back electrode of the second cell 31B can be connected in a traditional manner.

According to a preferable embodiment of the present disclosure, the secondary grid lines 312 and the conductive wires 32 are welded by a welding layer disposed on the secondary grid lines 312 or coating the metal wire. Alternatively, the welding layer is disposed at a position where the conductive wires 32 are in contact with the secondary grid lines 312 and/or the back electrodes 314 of the cell 31. More preferably, the welding layer is disposed at the positions where the conductive wires 32 are in contact with the secondary grid lines 312 of the cell 31 and in contact with the back electrodes 314 thereof respectively. The welding layer can be only applied to the secondary grid lines 312 and back electrodes 314, or can also be applied to the conductive wires 32. The welding layer may be a metal with a lower melting point or an alloy. The tin alloy can be a conventional tin alloy, for example, containing Sn, and at least one of Bi, Pb, Ag and Cu, more specifically, i.e. SnBi, SnPb, SnBiCu, SnPbAg, etc, so as to avoid insufficient soldering between the conductive wires 32 and the secondary grid lines 312 and/or the back electrodes 314 of the cell, and to render the solar cell module higher photoelectric conversion efficiency.

In the cell array 30, the ratio of the thickness of the welding layer and the diameter of the metal wire is (0.02-0.5):1. In the present disclosure, when there is a welding layer disposed at a position where the conductive wires 32 are in contact with the secondary grid lines 312 and/or the back electrodes 314 of the cell 31, the conductive wires 32 can be a metal wire which is not coated with a welding layer, for example, a copper wire.

In an embodiment, the conductive wires (including the front conductive wires 32A and back conductive wires 32B) include a metal wire and an alloy layer with a low melting point coating the metal wire. The alloy layer may coat the metal wire completely or partially. When the alloy layer coats the metal wire partially, the alloy layer is, preferably, formed at a position where the alloy layer is welded with the secondary grid lines 312 and/or the back electrodes 314 of the cell 31. When the alloy layer coats the metal wire completely, the alloy layer can coat the periphery of the metal wire in a circular manner. The thickness of the alloy layer can fall into a relatively wide range. Preferably, the alloy layer has a thickness of 1 to 100 μm, more preferably, 1 to 30 μm. The alloy for forming the alloy layer with a low melting point may be a conventional alloy with a low melting point which can be 100 to 200° C. Preferably, the alloy with the low melting point contains Sn, and at least one of Bi, In, Ag, Sb, Pb and Zn, more preferably, containing Sn, Bi, and at least one of In, Ag, Sb, Pb and Zn. Specifically, the alloy may be at least one of Sn—Bi alloy, In—Sn alloy, Sn—Pb alloy, Sn—Bi—Pb alloy, Sn—Bi—Ag alloy, In—Sn—Cu alloy, Sn—Bi—Cu alloy and Sn—Bi—Zn alloy. Most preferably, the alloy is Bi—Sn—Pb alloy, for example, containing 40 weight percent of Sn, 55 weight percent of Bi, and 5 weight percent of Pb (i.e. Sn40%-Bi55%-Pb5%). The thickness of the alloy layer with the low melting point can be 0.001 to 0.06 mm. The conductive wire 32 may have a cross section of 0.01 to 0.5 mm². The metal wire body can be conventional in the art, for example, a copper wire.

In the cell array 30, the cell 31 can be a conventional cell 31 in the art, for example, a polycrystalline silicon cell 31. The secondary grid lines 312 on the shiny surface of the cell 31 can be Ag, Cu, Sn, and tin alloy. The secondary grid line 312 has a width of 40 to 80 μm and a thickness of 5 to 20 μm; there are 50 to 120 secondary grid lines, a distance between adjacent secondary grid lines ranging from 0.5 to 3 mm. The back electrodes 314 on the back surface of the cell 31 can be made of Ag, Cu, Sn and tin alloys. The back electrodes 314 are usually in a ribbon pattern, and have a width of 1 to 4 mm, and a thickness of 5 to 20 μm.

The solar cell array 30 according to another embodiment of the present disclosure is illustrated with reference to FIG. 6.

The solar cell array 30 according to the embodiment of the present disclosure comprises n×m cells 31. In other words, a plurality of cells 31 are arranged in an n×m matrix form, n representing a column, and m representing a row. More specifically, in the embodiment, 36 cells 31 are arranges into six columns and six rows, i.e. n=m=6. It can be understood that the present disclosure is not limited thereto. For example, the column number and the row number can be different. For convenience of description, in FIG. 6, in a direction from left to right, the cells 31 in one row are called a first cell 31, a second cell 31, a third cell 31, a fourth cell 31, a fifth cell 31, and a sixth cell 31 sequentially; in a direction from up to down, the columns of the cells 31 are called a first column of cells 31, a second column of cells 31, a third column of cells 31, a fourth column of cells 31, a fifth column of cells 31, and a sixth column of cells 31 sequentially.

In a row of the cells, the metal wire extends reciprocally between a surface of a first cell 31 and a surface of a second cell 31 adjacent to the first cell 31; in two adjacent rows of cells 31, the metal wire extends reciprocally between a surface of a cell 31 in a $a^{th}$ row and a surface of a cell in a $(a+1)^{th}$ row, and m−1≥a≥1.

Figure 6:
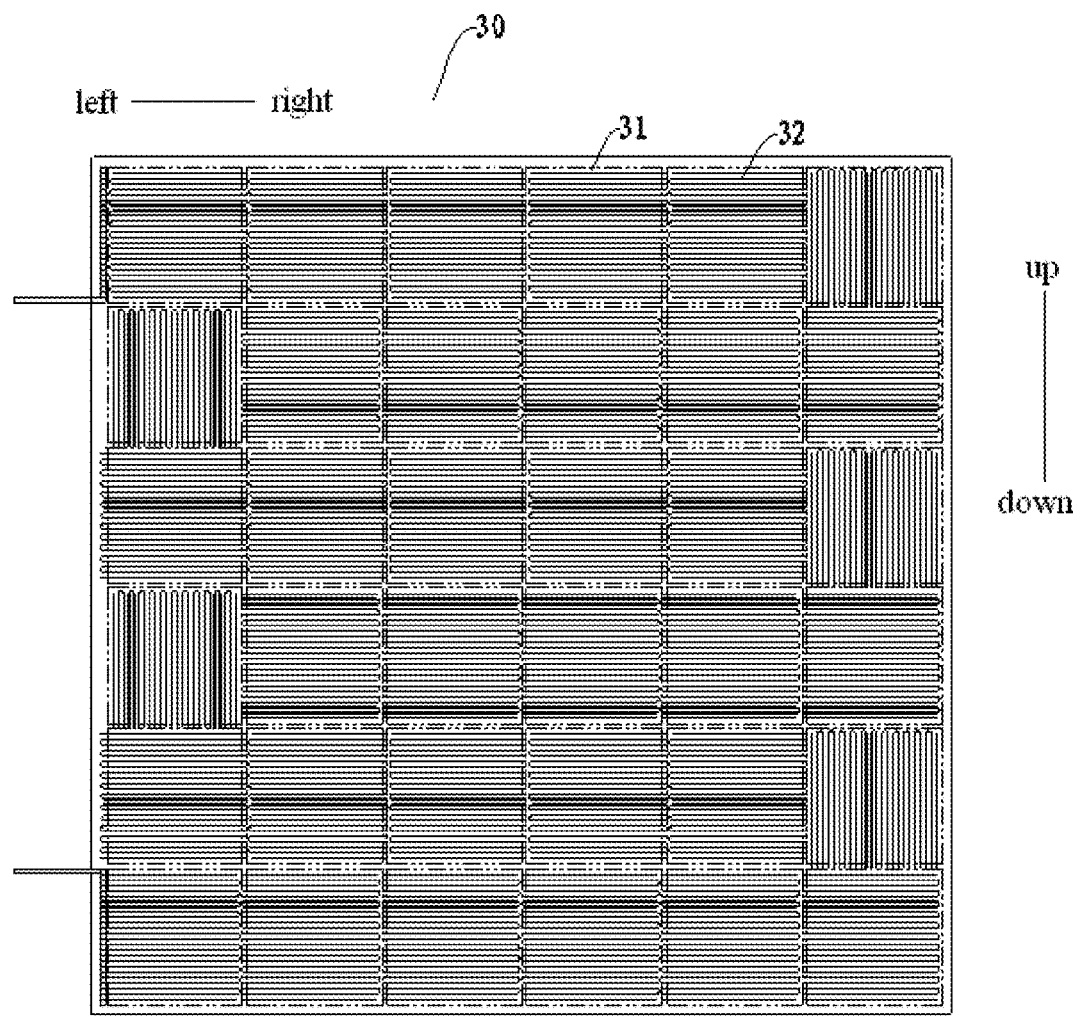
FIG. 6 is a plan view of a solar cell array according to another embodiment of the present disclosure.

As shown in FIG. 6, in a specific example, in a row of the cells 31, the metal wire extends reciprocally between a front surface of a first cell 31 and a back surface of a second cell 31 adjacent to the first cell 31, so as to connect the cells in one row in series. In two adjacent rows of cells 31, the metal wire extends reciprocally between a front surface of a cell 31 at an end of the $a^{th}$ row and a back surface of a cell 31 at an end of the $(a+1)^{th}$ row, to connect the two adjacent rows of cells 31 in series.

More preferably, in the two adjacent rows of cells 31, the metal wire extends reciprocally between the surface of the cell 31 at an end of the $a^{th}$ row and the surface of the cell 31 at an end of the $(a+1)^{th}$ row, the end of the $a^{th}$ row and the end of the $(a+1)^{th}$ row located at the same side of the matrix form, as shown in FIG. 6, located at the right side thereof.

More specifically, in the embodiment as shown in FIG. 6, in the first row, a first metal wire extends reciprocally between a front surface of a first cell 31 and a back surface of the second cell 31; a second metal wire extends reciprocally between a front surface of the second cell 31 and a back surface of a third cell 31; a third metal wire extends reciprocally between a front surface of the third cell 31 and a back surface of a fourth cell 31; a fourth metal wire extends reciprocally between a front surface of the fourth cell 31 and a back surface of a fifth cell 31; a fifth metal wire extends reciprocally between a front surface of the fifth cell 31 and a back surface of a sixth cell 31. In such a way, the adjacent cells 31 in the first row are connected in series by corresponding metal wires.

A sixth metal wire extends reciprocally between a front surface of the sixth cell 31 in the first row and a back surface of a sixth cell 31 in the second row, such that the first row and the second row are connected in series. A seventh metal wire extends reciprocally between a front surface of the sixth cell 31 in the second row and a back surface of a fifth cell 31 in the second row; a eighth metal wire extends reciprocally between a front surface of the fifth cell 31 in the second row and a back surface of a fourth cell 31 in the second row, until a eleventh metal wire extends reciprocally between a front surface of a second cell 31 in the second row and a back surface of a first cell 31 in the second row, and then a twelfth metal wire extends reciprocally between a front surface of the first cell 31 in the second row and a back surface of a first cell 31 in the third row, such that the second row and the third row are connected in series. Sequentially, the third row and the fourth row are connected in series, the fourth row and the fifth row connected in series, the fifth row and the sixth row connected in series, such that the cell array 30 is manufacture. In this embodiment, a bus bar is disposed at the left side of the first cell 31 in the first row and the left side of the first cell 31 in the sixth row respectively; a first bus bar is connected with a conductive wire extending from the left side of the first cell 31 in the first row, and a second bus bar is connected with a conductive wire extending from the left side of the first cell 31 in the sixth row.

As said above, the cell bodies in the embodiments of the present disclosure are connected in series by the conductive wires—the first row, the second row, the third row, the fourth row, the fifth row and the sixth row are connected in series by the conductive wires. As shown in the figures, the metal wire may extend beyond the cell for connection with other loads. For example, alternatively, the second and third row, and the fourth and fifth rows can be connected in parallel with a diode respectively to avoid light spot effect. The diode can be connected in a manner commonly known to those skilled in the art, for example, by a bus bar.

However, the present disclosure is not limited to the above. For example, the first and second rows can be connected in series, the third and fourth rows connected in series, the fifth and sixth rows connected in series, and meanwhile the second and third rows are connected in parallel, the fourth and fifth connected in parallel. In such a case, a bus bar can be disposed at the left or right side of corresponding rows respectively.

Alternatively, the cells 31 in the same row can be connected in parallel. For example, a metal wire extends reciprocally from a front surface of a first cell 31 in a first row through the front surfaces of the cells 31 in the second row to the sixth row.

In some specific embodiments of the present disclosure, a binding force between the metal wire and the cells 31 ranges from 0.1 N to 0.8 N. That's to say, the binding force between the conductive wires 32 and the cells 31 ranges from 0.1 N to 0.8 N. Preferably, the binding force between the metal wire and the cells ranges from 0.2 N to 0.6 N, so as to secure the welding between the cells and the metal wire, to avoid sealing-off of the cells in the operation and the transferring process and performance degradation due to poor connection, and to lower the cost.

The solar cell module 100 according to embodiments of the present disclosure is illustrated with reference to FIG. 10 and FIG. 11.

Figure 10:
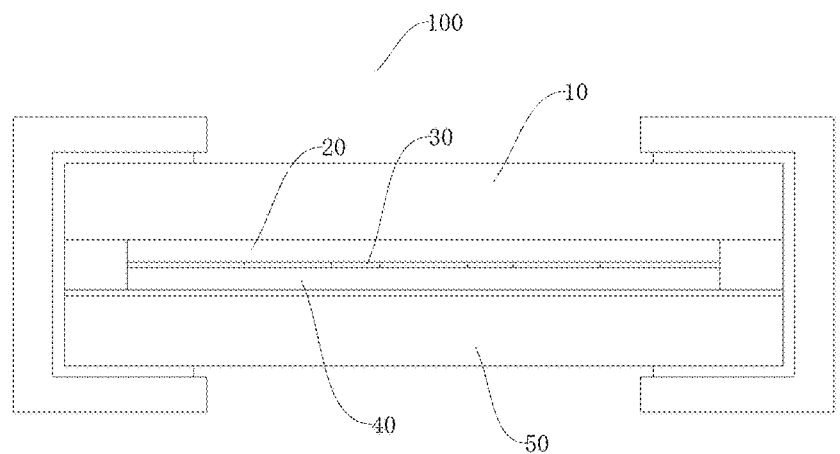
FIG. 10 is a schematic diagram of a solar cell module according to embodiments of the present disclosure.
Figure 11:
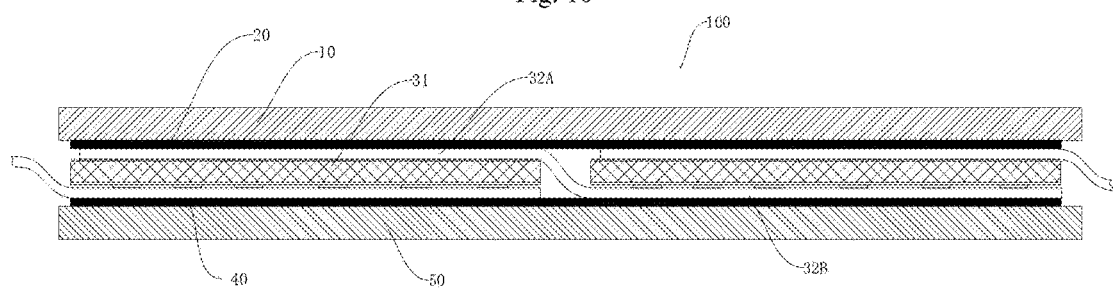
FIG. 11 is a sectional view of part of the solar cell module according to FIG. 10.

As shown in FIG. 10 and FIG. 11, the solar cell module 100 according to embodiments of the present disclosure includes an upper cover plate 10, a front adhesive layer 20, the cell array 30, a back adhesive layer 40 and a back plate 50 superposed sequentially along a direction from up to down.

The front adhesive layer 20 and the back adhesive layer 40 are adhesive layers commonly used in the art. Preferably, the front adhesive layer 20 and the back adhesive layer 40 are polyethylene-octene elastomer (POE) and/or ethylene-vinyl acetate copolymer (EVA). In the present disclosure, polyethylene-octene elastomer (POE) and/or ethylene-vinyl acetate copolymer (EVA) are conventional products in the art, or can be obtained in a method known to those skilled in the art.

In the embodiments of the present disclosure, the upper cover plate 10 and the back plate 50 can be selected and determined by conventional technical means in the art. Preferably, the upper cover plate 10 and the back plate 50 can be transparent plates respectively, for example, glass plates.

In the process of manufacturing the solar cell module 100, the conductive wire can be first bounded or welded with the secondary grid lines and the back electrode of the cell 31, and then superposed and laminated.

Other components of the solar cell module 100 according to the present disclosure are known in the art, which will be not described in detail herein.

Specifically, the solar module 100 includes an upper cover plate 10, a front adhesive layer 20, the cell array 30, a back adhesive layer 40 and a back plate 50. The cell array 30 includes a plurality of cells 31, and adjacent cells 31 are connected by the plurality of conductive wires 32. The conductive wires 32 are constituted by the metal wire S. The conductive wires 32 are welded with the secondary grid lines. The front adhesive layer 20 contacts with the conductive wires 32 directly and fills between the adjacent conductive wires 32.

That's to say, the solar cell module 100 according to the present disclosure includes an upper cover plate 10, a front adhesive layer 20, the cell array 30, a back adhesive layer 40 and a back plate 50 superposed sequentially along a direction from up to down. The cell array 30 includes a plurality of cells 31 and conductive wires 32 for connecting the plurality of cells 31. The conductive wires are constituted by the metal wire S which extends reciprocally between surfaces of two adjacent cells 31.

The conductive wires 32 are electrically connected with the cells 31, in which the front adhesive layer 20 on the cells 31 contacts with the conductive wires 32 directly and fills between the adjacent conductive wires 32, such that the front adhesive layer 20 can fix the conductive wires 32, and separate the conductive wires 32 from air and moisture from the outside world, so as to prevent the conductive wires 32 from oxidation and to guarantee the photoelectric conversion efficiency.

Thus, in the solar cell module 100 according to embodiments of the present disclosure, the conductive wires 32 constituted by the metal wire S which extends reciprocally replace traditional primary grid lines and solder strips, so as to reduce the cost. The metal wire S extends reciprocally to decrease the number of free ends of the metal wire S and to save the space for arranging the metal wire S, i.e. without being limited by the space. The number of the conductive wires 32 constituted by the metal wire which extends reciprocally may be increased considerably, which is easy to manufacture, and thus is suitable for mass production. The front adhesive layer 20 contacts with the conductive wires 32 directly and fills between the adjacent conductive wires 32, which can effectively isolate the conductive wires from air and moisture to prevent the conductive wires 32 from oxidation to guarantee the photoelectric conversion efficiency.

In some specific embodiments of the present disclosure, the metal wire S extends reciprocally between a front surface of a first cell and a back surface of a second cell adjacent to the first cell; the front adhesive layer 20 contacts with the conductive wires on the front surface of the first cell 31 directly and fills between the adjacent conductive wires 32 on the front surface of the first cell 31; the back adhesive layer 40 contacts with the conductive wires 32 on the back surface of the second cell 31 directly and fills between the adjacent conductive wires 32 on the back surface of the second cell 31.

In other words, in the present disclosure, the two adjacent cells 31 are connected by the metal wire S. In the two adjacent cells 31, the front surface of the first cell 31 is connected with the metal wire S, and the back surface of the second cell 31 is connected with the metal wire S.

The front adhesive layer 20 on the first cell 31 whose front surface is connected with the metal wire S is in direct contact with the metal wire S on the front surface of the first cell 31 and fills between the adjacent conductive wires 32. The back adhesive layer 40 on the second cell 31 whose back surface is connected with the metal wire S is in direct contact with the metal wire S on the back surface of the second cell 31 and fills between the adjacent conductive wires 32 (as shown in FIG. 2).

Consequently, in the solar cell module 100 according to the present disclosure, not only the front adhesive layer 20 can separate the conductive wires 32 on the front surfaces of part of the cells 31 from the outside world, but also the back adhesive layer 40 can separate the conductive wires 32 on the back surfaces of part of the cells 31 from the outside world, so as to further guarantee the photoelectric conversion efficiency of the solar cell module 100.

In some specific embodiments of the present disclosure, for a typical cell with a dimension of 156 mm×156 mm, the solar cell module has a series resistance of 380 to 440 mΩ, per 60 cells. The present disclosure is not limited to 60 cells, and there may be 30 cells, 72 cells, etc. When there are 72 cells, the series resistance of the solar cell module is 456 to 528 mΩ, and the electrical performance of the cells is better.

In some specific embodiments of the present disclosure, for a typical cell with a dimension of 156 mm×156 mm, the solar cell module has an open-circuit voltage of 37.5-38.5 V per 60 cells. The present disclosure is not limited to 60 cells, and there may be 30 cells, 72 cells, etc. The short-circuit current is 8.9 to 9.4 A, and is not related to the number of the cells.

In some specific embodiments of the present disclosure, the solar cell module has a fill factor of 0.79 to 0.82, which is independent from the dimension and number of the cells, and can affect the electrical performance of the cells.

In some specific embodiments of the present disclosure, for a typical cell with a dimension of 156 mm×156 mm, the solar cell module has a working voltage of 31.5-32 V per 60 cells. The present disclosure is not limited to 60 cells, and there may be 30 cells, 72 cells, etc. The working current is 8.4 to 8.6 A, and is not related to the number of the cells.

In some specific embodiments of the present disclosure, for a typical cell with a dimension of 156 mm×156 mm, the solar cell module has a conversion efficiency of 16.5-17.4%, and a power of 265-280 W per 60 cells.

A method for manufacturing the solar cell module 100 according to the embodiments of the present disclosure will be illustrated with respect to FIG. 1 to FIG. 3 and FIG. 7 to FIG. 9.

Specifically, the method according to the embodiments of the present disclosure includes the following steps:

forming at least two conductive wires 32 by a metal wire that extends reciprocally a surface of a first cell 31 and a surface of a second cell 31 adjacent to the first cell 31, welding the conductive wires with a secondary grid line on a front surface of the cell 31, such that the adjacent cells 31 are connected by the conductive wires to constitute a cell array 30;

superposing the upper cover plate 10, the front adhesive layer 20, the cell array 30, the back adhesive layer 40 and the back plate 50 in sequence, in which the front surface of the cell 31 faces the front adhesive layer 20, and the back surface thereof faces the back adhesive layer 40, and laminating them to obtain the solar cell module 100.

The method includes the steps of preparing a solar array 30, superposing the upper cover plate 10, the front adhesive layer 20, the cell array 30, the back adhesive layer 40 and the back plate 50 in sequence, and laminating them to obtain the solar cell module 100. It can be understood that the method further includes other steps, for example, sealing the gap between the upper cover plate 10 and the back plate 50 by a sealant, and fixing the above components together by a U-shape frame, which are known to those skilled in the art, and thus will be not described in detail herein.

The method includes a step of forming a plurality of conductive wires by a metal wire which extends reciprocally on surfaces of cells 31 and is electrically connected with the surfaces of cells 31, such that the adjacent cells 31 are connected by the plurality of conductive wires to constitute a cell array 30.

Figure 7:
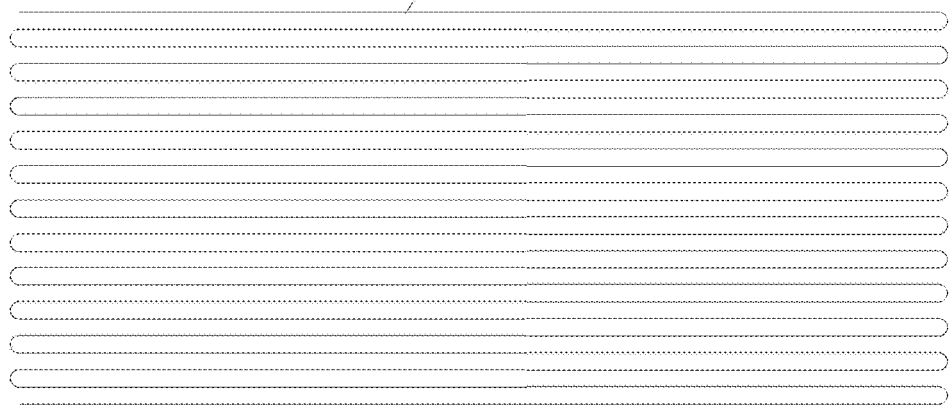
FIG. 7 is a schematic diagram of a metal wire extending reciprocally according to embodiments of the present disclosure.
Figure 8:
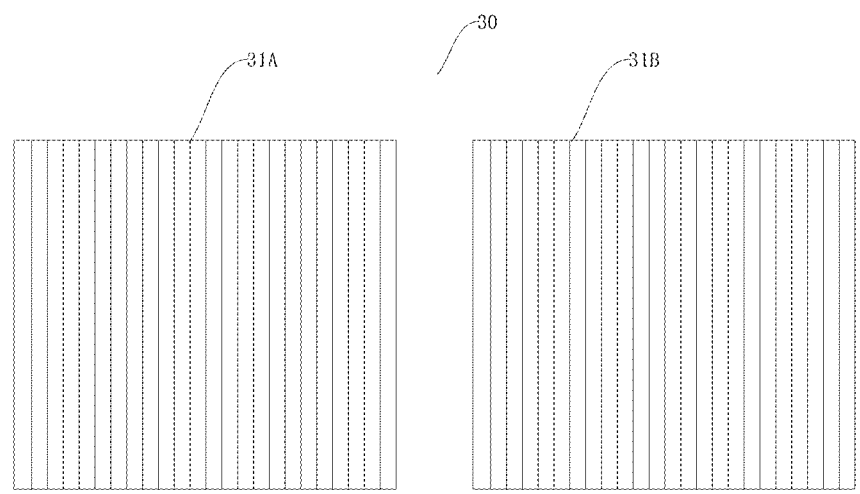
FIG. 8 is a schematic diagram of two cells of a solar cell array according to embodiments of the present disclosure.
Figure 9:
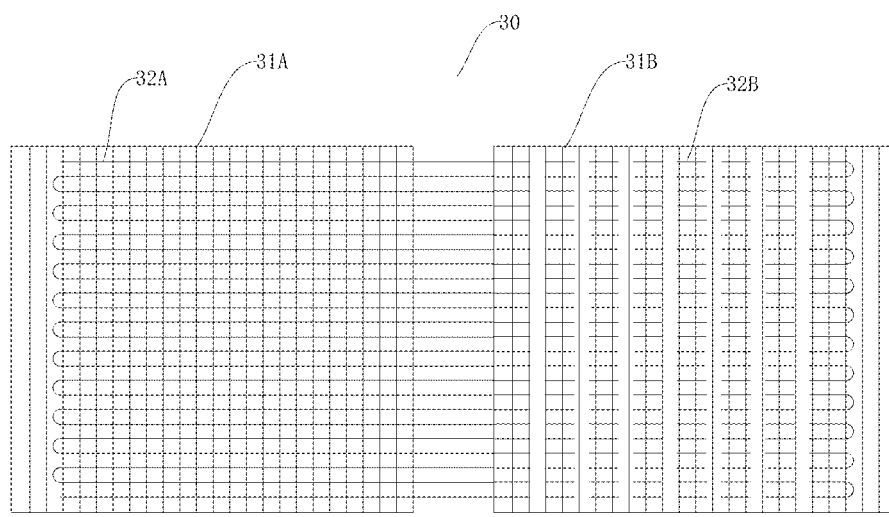
FIG. 9 is a sectional view of a solar cell array formed by connecting, by a metal wire, the two cells according to FIG. 8.

Specifically, as shown in FIG. 7, the metal wire extends reciprocally for 12 times under a strain. As shown in FIG. 8, a first cell 31 and a second cell 31 are prepared. As shown in FIG. 9, a front surface of the first cell 31 is connected with a metal wire, and a back surface of the second cell 31 is connected with the metal wire, such that the cell array 30 is formed. FIG. 9 shows two cells 31. When the cell array 30 has a plurality of cells 31, the metal wire which extends reciprocally connects the front surface of the first cell 31 and the back surface of the second cell 31 adjacent to the first cell 31, i.e. connecting a secondary grid line of the first cell 31 with a back electrode of the second cell 31 by the metal wire. The metal wire extends reciprocally under strain from two clips at two ends thereof. The metal wire can be winded only with the help of two clips, which saves the clips considerably and then reduces the assembling space.

In the embodiment shown in FIG. 9, the adjacent cells are connected in series. As said above, the adjacent cells can be connected in parallel by the metal wire based on practical requirements.

The cell array 30 obtained is superposed with the upper cover plate 10, the front adhesive layer 20, the back adhesive layer 40 and the back plate 50 in sequence, in which a front surface of the cell 31 faces the front adhesive layer 20, a back surface thereof facing the back adhesive layer 40, and laminating them to obtain the solar cell module 100. It can be understood that the metal wire is welded with the cell 31 when or before they are laminated.

The front adhesive layer 20 is disposed in direct contact with the conductive wires 32. In the process of laminating, the front adhesive layer 20 melts and fills the gaps between adjacent conductive wires 32. The back adhesive layer 40 is disposed in direct contact with the conductive wires 32. In the process of laminating, the back adhesive layer 40 melts and fills the gaps between adjacent conductive wires 32.

Example 1

Example 1 is used to illustrate the solar cell module 100 according to the present disclosure and the manufacturing method thereof.

(1) Manufacturing a Metal Wire S

An alloy layer of Sn40%-Bi55%-Pb5% (melting point: 125° C.) is attached to a surface of a copper wire, in which the copper wire has a cross section of 0.04 mm$^2$, and the alloy layer has a thickness of 16 μm. Hence, the metal wire S is obtained.

(2) Manufacturing a Solar Cell Module 100

A POE adhesive layer in 1630×980×0.5 mm is provided (melting point: 65° C.), and a glass plate in 1650×1000×3 mm and a polycrystalline silicon cell 31 in 156×156×0.21 mm are provided correspondingly. The cell 31 has 91 secondary grid lines (silver, 60 μm in width, 9 μm in thickness), each of which substantially runs through the cell 31 in a longitudinal direction, and the distance between the adjacent secondary grid lines is 1.7 mm. The cell 31 has five back electrodes (tin, 1.5 mm in width, 10 μm in thickness) on its back surface. Each back electrode substantially runs through the cell 31 in a longitudinal direction, and the distance between the adjacent back electrodes is 31 mm.

60 cells 31 are arranged in a matrix form (six rows and ten columns). In two adjacent cells 31 in a row, a metal wire extends reciprocally between a front surface of a first cell 31 and a back surface of a second cell 31 under strain. The metal wire extends reciprocally under a strain from two clips at two ends thereof, so as to form 20 parallel conductive wires. The secondary grid lines of the first cell 31 are welded with the conductive wires and the back electrodes of the second cell 31 are welded with the conductive wires at a welding temperature of 160° C. The distance between parallel adjacent conductive wires is 7.6 mm. Hence, 10 cells are connected in series into a row, and six rows of the cells of such kind are connected in series into a cell array via the bus bar. The surfaces of the upper glass plate 10 and the lower glass plate facing the cell 31 are coated with silica gel, and then butyl rubber sealing rubber strips are stuck around the silica gel. Then, an upper glass plate, an upper POE adhesive layer, multiple cells arranged in a matrix form and welded with the metal wire, a lower POE adhesive layer and a lower glass plate are superposed sequentially from up to down, in which the front surface of the cell 31 faces the front adhesive layer 20, such that the front adhesive layer 20 contacts with the conductive wires 32 directly; and the back surface of the cell 31 faces the back adhesive layer 40, and finally they are laminated in a laminator, in which the front adhesive layer 20 fills between adjacent conductive wires 32. In such way, a solar cell module A1 is obtained.

Comparison Example 1

Figure 13:
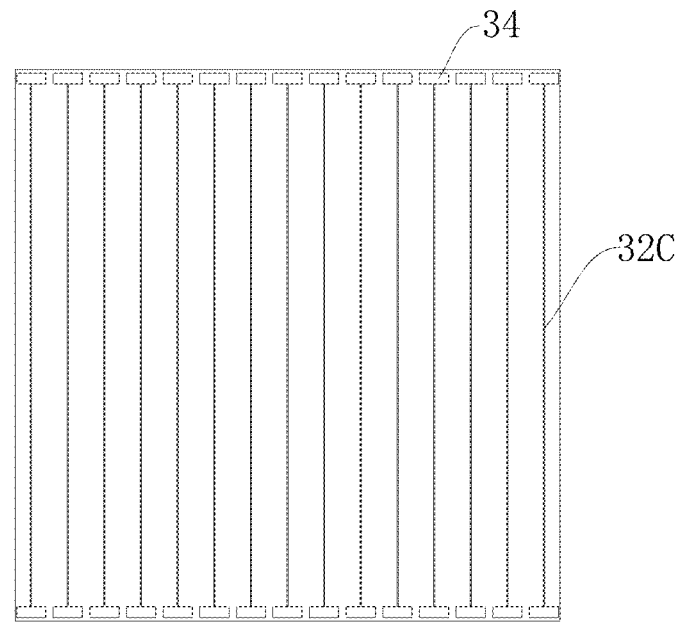
FIG. 13 is a schematic diagram of a metal wire under a strain in Comparison Example 1.

The difference between Comparison example 1 and Example 1 lies in that the cells 31 are arranged in a matrix form, and in two adjacent cells, the fifteen parallel metal wires, by wiredrawing as shown in FIG. 13, are strained via the clips 34 at the ends of each metal wire, and thus the cells are flattened at a strain of 2 N of the clips. Each of the fifteen parallel metal wires is welded with secondary grid lines on a front surface of a first cell 31 respectively, and welded with back electrodes on a back surface of a second cell 31. The distance between the parallel adjacent conductive wires 32C is 9.9 mm (as shown in FIG. 13). In such a way, a solar cell module D1 is obtained.

Comparison Example 2

The differences between Comparison example 2 and Comparison example 1 lie in that the cells are arranged in a matrix form; 15 metal wires connected in series are pasted at a transparent adhesive layer, and the metal wires are attached to the solar cells. In two adjacent cells, the metal wire connects a front surface of a first cell and a back surface of a second cell. Then, an upper glass plate, an upper POE adhesive layer, and a first transparent adhesive layer, multiple cells arranged in a matrix form and welded with the metal wire, a second transparent adhesive layer, a lower POE adhesive layer and a lower glass plate are superposed sequentially from up to down. Thus, a solar cell module D2 is obtained.

Example 2

Example 2 is used to illustrate the solar cell module 100 according to the present disclosure and the manufacturing method thereof (1) Manufacturing a Metal Wire An alloy layer of Sn40%-Bi55%-Pb5% (melting point: 125° C.) is attached to a surface of a copper wire, in which the copper wire has a cross section of 0.03 mm$^2$, and the alloy layer has a thickness of 10 μm. Hence, the metal wire S is obtained.

(2) Manufacturing a Solar Cell Module

A EVA adhesive layer in 1630×980×0.5 mm is provided (melting point: 60° C.), and a glass plate in 1650×1000×3 mm and a polycrystalline silicon cell 31 in 156×156×0.21 mm are provided correspondingly. The cell 31 has 91 secondary grid lines (silver, 60 μm in width, 9 μm in thickness) at its shiny surface, each of which substantially runs through the cell 31 in a longitudinal direction, and the distance between the two adjacent secondary grid lines is 1.7 mm. The cell 31 has five back electrodes (tin, 1.5 mm in width, 10 in thickness) on its back surface. Each back electrode substantially runs through the cell 31 in the longitudinal direction, and the distance between the two adjacent back electrodes is 31 mm.

60 cells 31 are arranged in a matrix form (six rows and ten columns). In two adjacent cells 31 in a row, a metal wire extends reciprocally between a front surface of a first cell 31 and a back surface of a second cell 31 under strain. The metal wire extends reciprocally under strain from two clips at two ends thereof, so as to form 26 parallel conductive wires. The secondary grid lines of the first cell 31 are welded with the conductive wires and the back electrodes of the second cell 31 are welded with the conductive wires at a welding temperature of 160° C. The distance between parallel adjacent conductive wires is 5.9 mm. Hence, 10 cells are connected in series into a row, and six rows of the cells of such kind are connected in series into a cell array via the bus bar. The surfaces of the upper glass plate 10 and the lower glass plate facing the cell 31 are coated with silica gel, and then butyl rubber sealing rubber strips are stuck around the silica gel. Then, an upper glass plate, an upper POE adhesive layer, multiple cells arranged in a matrix form and welded with the metal wire, a lower POE adhesive layer and a lower glass plate are superposed sequentially from up to down, in which the front surface of the cell 31 faces the front adhesive layer 20, such that the front adhesive layer 20 contacts with the conductive wires 32 directly; and the back surface of the cell 31 faces the back adhesive layer 40, and finally they are laminated in a laminator, in which the front adhesive layer 20 fills between adjacent conductive wires 32. In such way, a solar cell module A2 is obtained.

Example 3

Figure 12:
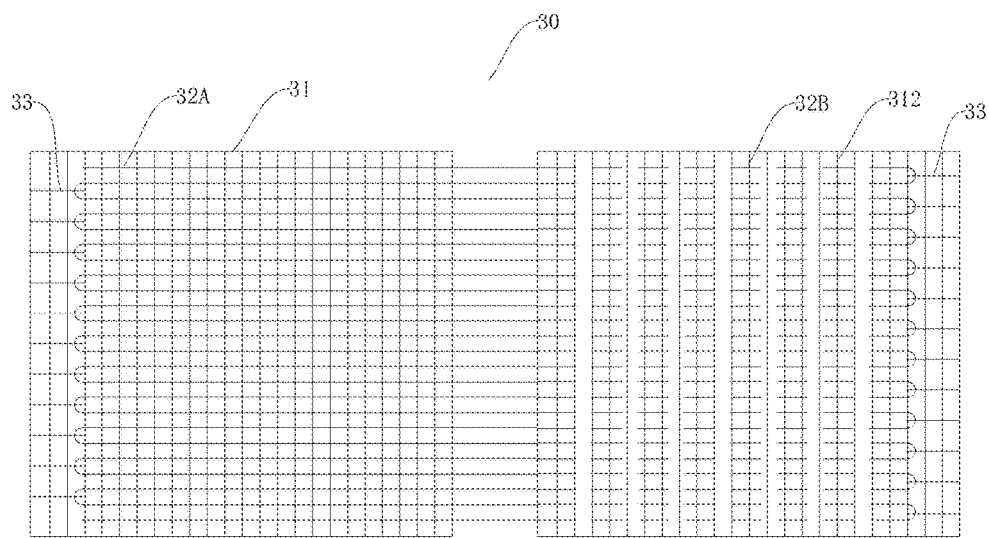
FIG. 12 is a schematic diagram of a solar cell array according to another embodiment of the present disclosure.

The solar cell module is manufactured according to the method in Example 2, but the difference compared with Example 2 lies in that short grid lines 33 (silver, 0.1 mm in width) are disposed on the secondary grid lines 312 of the front surface of the cell 31, and are perpendicular to the secondary grid lines 312 for connecting part of the secondary grid lines 312 at the edges of the front surface of the cell 31 with the conductive wires 32. As shown in FIG. 12, a solar cell module A3 is obtained.

Example 4

The solar cell module is manufactured according to the method in Example 3, but the difference compared with Example 3 lies in that the cell array is connected in such a manner that in two adjacent rows of cells, the conductive wires extend from a shiny surface of a cell at an end of the $a^{th}$ row (a≥1) to form electrical connection with a back surface of a cell 31 at an adjacent end of the $(a+1)^{th}$ row, so as to connect the two adjacent rows of cells. The conductive wires for connecting the two adjacent rows of cells 31 are arranged in perpendicular to the conductive wires for connecting the adjacent cells 31 in the two rows. In such a way, a solar cell module A4 is obtained.

Testing Example 1

(1) Whether the metal wire in the solar cell module drifts is observed with the naked eyes;
(2) According to the method disclosed in IEC904-1, the solar cell modules manufactured in the above examples and the comparison example are tested with a single flash simulator under standard test conditions (STC): 1000 W/m² of light intensity, AM1.5 spectrum, and 25° C. The photoelectric conversion efficiency of each cell is recorded. The testing result is shown in Table 2.

TABLE 2

| | Solar cell module | | | | | |
| --- | --- | --- | --- | --- | --- | --- |
| | A1 | D1 | D2 | A2 | A3 | A4 |
| Metal wire drifting phenomenon | no | Slightly | no | no | no | no |
| Photoelectric conversion efficiency | 16.8% | 15.3% | 15.5% | 17.1% | 17.2% | 17.3% |
| Series resistance (mΩ) | 451 | 518 | 498 | 442 | 427 | 425 |
| Fill factor | 0.779 | 0.742 | 0.764 | 0.788 | 0.793 | 0.796 |
| Open-circuit voltage (V) | 37.84 | 37.52 | 37.44 | 37.85 | 37.9 | 37.94 |
| Short-circuit current (A) | 9.166 | 8.836 | 8.712 | 9.22 | 9.198 | 9.212 |
| Working voltage (V) | 31.54 | 30.32 | 30.49 | 31.86 | 31.97 | 31.92 |
| Working current (A) | 8.568 | 8.117 | 8.176 | 8.633 | 8.651 | 8.717 |
| Power (W) | 270.2 | 246.1 | 249.3 | 275 | 276.6 | 278.2 |

The fill factor refers to a ratio of the power at the maximum power point of the solar cell module and the maximum power theoretically at zero resistance, and represents the proximity of the actual power with respect to the theoretic maximum power, in which the greater the value is, the higher the photoelectric conversion efficiency is. Generally, the series resistance is small, so the fill factor is great. The photoelectric conversion efficiency refers to a ratio of converting the optical energy into electric energy by the module under a standard lighting condition (1000 W/m² of light intensity). The series resistance is equivalent to the internal resistance of the solar module, in which the greater the value is, the poorer the performance of the module is. The fill factor represents a ratio of the actual maximum power and the theoretical maximum power of the module, in which the greater the value is, the better the performance of the module is. The open-circuit voltage refers to the voltage of the module in an open circuit under a standard lighting condition. The short-circuit current refers to the current of the module in a short circuit under a standard lighting condition. The working voltage is the output voltage of the module working with the largest power under a standard lighting condition. The working current is the output current of the module working with the largest power under a standard lighting condition. The power is the maximum power which the module can reach under a standard lighting condition.

It can be indicated from Table 2 that for the solar cell module according to the embodiments of the present disclosure, the metal wire will not drift, and higher photoelectric conversion efficiency can be obtained.

Example 5

The solar cell module is manufactured according to the method in Example 1, but the difference compared with Example 1 lies in that: a metal wire whose diameter is 0.25 mm extends reciprocally to form 15 cells with different numbers (in the range of 10 to 40) of conductive wires. As for the cell module manufactured in the above method, a curve graph of the relationship between the number of conductive wires and photoelectric conversion efficiency in the solar cell array is shown in FIG. 14. Hence, it finds out that the optimal number of the conductive wires ranges from 20 to 30.

Example 6

The solar cell module is manufactured according to the method in Example 5, but the difference compared with Example 5 lies in that: metal wires whose diameters are shown in Table 3 extend reciprocally respectively to form 20 solar cells with different numbers of conductive wires. As for the cell module manufactured in the above method, a curve graph of the relationship between the number of conductive wires and photoelectric conversion efficiency in the solar cell array is figured out. The optimal number of the conductive wires is shown in Table 3.

TABLE 3

| | Diameter of metal wire (mm) | | | | | |
| --- | --- | --- | --- | --- | --- | --- |
| | 0.1 | 0.12 | 0.14 | 0.16 | 0.18 | 0.2 |
| Number of metal wire | 65-79 | 54-66 | 46-56 | 40-48 | 34-42 | 30-36 |
| Optimal number | 72 | 60 | 51 | 44 | 38 | 33 |
| | Diameter of metal wire (mm) | | | | | |
| | 0.26 | 0.28 | 0.3 | 0.32 | 0.34 | 0.36 |
| Number of metal wire | 21-25 | 18-22 | 16-20 | 15-19 | 14-18 | 14-17 |
| Optimal number | 23 | 20 | 18 | 17 | 16 | 15 |

The inventor of the present disclosure obtains a solar cell module with better comprehensive performance through numerous tests.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," and "counterclockwise" should be construed to refer to the orientation as then described or as shown in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," or "some examples" means that a particular feature, structure, material, or characteristic described in connection with the embodiment or example is included in at least one embodiment or example of the present disclosure. Thus, these terms throughout this specification do not necessarily refer to the same embodiment or example of the present disclosure. Furthermore, the particular features, structures, materials, or characteristics may be combined in any suitable manner in one or more embodiments or examples.

Although embodiments of the present disclosure have been shown and described, it would be appreciated by those skilled in the art that changes, modifications, alternatives and variations can be made in the embodiments without departing from the scope of the present disclosure.

What is claimed is:

1. A solar cell array, comprising:
a plurality of cells including a first cell and a second cell adjacent to the first cell, wherein the first cell and the second cell are connected by at least one metal wire, the at least one metal wire extending reciprocally between a surface of the first cell and a surface of the second cell to form a plurality of conductive wires, a number of conductive wires in the plurality of conductive wires being n, $y-y\times20\% \leq n \leq y+y\times20\%$, in which n is an integer and $y=4.0533X^{-128}/156^2*A*B$, in which X is a diameter value of the at least one metal wire with mm as a unit, $0.1 \leq X \leq 0.5$, A and B representing length and width of each of the plurality of cells with mm as the unit; and the plurality of cells comprising secondary grid lines disposed on front surfaces thereof, and the plurality of conductive wires being welded with the secondary grid lines by a welding layer;
wherein the welding layer disposed on at least one of the plurality of conductive wires around a circumference of the at least one of the plurality of conductive wires and no insulating material is present directly between the plurality of conductive wires and the secondary grid lines; and
wherein:
the secondary grid lines comprise an edge secondary grid line adjacent to an edge of the first cell,
the edge secondary grid line comprises at least one welding portion and at least one non-welding portion, and
each instance of the at least one welding portion has a length longer than each instance of the at least one non-welding portion, and
the length of the at least one welding portion and the length of the at least one non-welding portion are parallel to a longitudinal direction of the edge secondary grid line.

2. The solar cell array according to claim 1, wherein $y-y\times10\% \leq n \leq y+y\times10\%$, and 0.1 mm$\leq X$ mm$\leq 0.4$ mm.

3. The solar cell array according to claim 1, wherein $y-y\times5\% \leq n \leq y+y\times5\%$.

4. The solar cell array according to claim 1, wherein the at least one metal wire extends reciprocally between a front surface of the first cell and a back surface of the second cell; a back electrode with which the metal wire is welded is disposed on the back surface of the second cell.

5. The solar cell array according to claim 1, wherein two of the plurality of conductive wires are adjacent to each other and form a U-shape structure or a V-shape structure.

6. The solar cell array according to claim 1, wherein the at least one metal wire comprises only one metal wire.

7. The solar cell array according to claim 1, wherein the plurality of cells are arranged in an n×m matrix form, n representing a column, and m representing a row;
in a row of plurality of cells, the at least one metal wire extends reciprocally between the surfaces of two adjacent cells in the row; in two adjacent rows of plurality of cells, the at least one metal wire extends reciprocally between a surface of a cell in a $a^{th}$ row and a surface of a cell in a $(a+1)^{th}$ row; and $m-1 \geq a \geq 1$.

8. The solar cell array according to claim 7, wherein in two adjacent rows of the plurality of cells, the at least one metal wire extends reciprocally between a surface of a cell at an end of the $a^{th}$ row and a surface of a cell at an end of the $(a+1)^{th}$ row, the end of the $a^{th}$ row and the end of the $(a+1)^{th}$ row located at the same side of the matrix form.

9. The solar cell array according to claim 8, wherein in a row of cells, the at least one metal wire extends reciprocally between a front surface of a first cell and a back surface of a second cell adjacent to the first cell;
in two adjacent rows of cells, the metal wire extends reciprocally between a front surface of a cell at an end of the $a^{th}$ row and a back surface of a cell at an end of the $(a+1)^{th}$ row, to connect the two adjacent rows of cells in series.

10. The solar cell array according to claim 7, wherein the at least one metal wire comprises a first metal wire portion and a second metal wire portion, wherein the first metal wire portion extends reciprocally between adjacent cells in a row, and the second metal wire portion extends reciprocally between cells in adjacent rows.

11. The solar cell array according to claim 1, wherein the welding layer contains Sn, and at least one of Bi, In, Ag, Sb, Pb and Zn.

12. The solar cell array according to claim 11, wherein the welding layer contains Sn, Bi, and at least one of In, Ag, Sb, Pb and Zn.

13. A solar cell array, comprising a plurality of cells including a first cell and a second cell adjacent to the first cell, wherein the first cell and the second cell are connected by at least one metal wire, the at least one metal wire extending reciprocally between a surface of the first cell and a surface of the second cell to form a plurality of conductive wires, in which a relationship between a number of conductive wires in the plurality of conductive wires on each of the plurality of cells whose length and width are 156 mm respectively and a diameter of the at least one metal wire is shown in Table 1; the plurality of cells comprising secondary grid lines disposed on front surfaces thereof, and the plurality of conductive wires being welded with the secondary grid lines by a welding layer;
wherein the welding layer disposed on at least one of the plurality of conductive wires around a circumference of the at least one of the plurality of conductive wires and no insulating material is present directly between the plurality of conductive wires and the secondary grid lines; and

TABLE 1

| | Diameter of metal wire (mm) | | | | | |
|---|---|---|---|---|---|---|
| | 0.1 | 0.12 | 0.14 | 0.16 | 0.18 | 0.2 |
| Number of metal wire | 65-79 | 54-66 | 46-56 | 40-48 | 34-42 | 30-36 |
| | Diameter of metal wire (mm) | | | | | |
| | 0.26 | 0.28 | 0.3 | 0.32 | 0.34 | 0.36 |
| Number of metal wire | 21-25 | 18-22 | 16-20 | 15-19 | 14-18 | 14-17 | wherein:
- the secondary grid lines comprise an edge secondary grid line adjacent to an edge of the first cell,
- the edge secondary grid line comprises at least one welding portion and at least one non-welding portion, and
- each instance of the at least one welding portion has a length longer than each instance of the at least one non-welding portion, and
- the length of the at least one welding portion and the length of the at least one non-welding portion are parallel to a longitudinal direction of the edge secondary grid line.

14. A solar cell module, comprising an upper cover plate, a front adhesive layer, a solar cell array of claim 1, a back adhesive layer and a back plate superposed in sequence.

15. The solar cell module according to claim 14, wherein the front adhesive layer contacts with the plurality of conductive wires directly and is disposed between adjacent ones of the plurality of conductive wires.

16. The solar cell module according to claim 14, wherein the at least one metal wire extends reciprocally between a front surface of a first cell and a back surface of a second cell adjacent to the first cell; the front adhesive layer contacts with the plurality of conductive wires on the front surface of the first cell directly and is disposed between adjacent conductive wires on the front surface of the first cell; the back adhesive layer contacts with the plurality of conductive wires on the back surface of the second cell directly and is disposed between adjacent conductive wires on the back surface of the second cell.

17. The solar cell module according to claim 14, wherein each of the plurality of cells has a dimension of 156 mm×156 mm; and the solar cell module has a series resistance of 380 to 440 mΩ per 60 cells.

18. The solar cell module according to claim 14, wherein each of the plurality of cells has a dimension of 156 mm×156 mm; and the solar cell module has a conversion efficiency of 16.5-17.4%.

19. The solar cell array according to claim 1, wherein the plurality of conductive wires are disposed perpendicular to the secondary grid lines on the surfaces of the first and second cells.

* * * * *

UNITED STATES PATENT AND TRADEMARK OFFICE
CERTIFICATE OF CORRECTION

PATENT NO. : 10,529,868 B2
APPLICATION NO. : 14/738409
DATED : January 7, 2020
INVENTOR(S) : Zhiqiang Zhao et al.

Page 1 of 1

It is certified that error appears in the above-identified patent and that said Letters Patent is hereby corrected as shown below:

In the Claims

In Column 25, Claim 1, Line 37, delete "$y=4.0533X^{-128}/156^2*A*B$" and replace with
-- $y=4.0533X^{-1.28}/156^2*A*B$ --

Signed and Sealed this
First Day of December, 2020

Andrei Iancu
*Director of the United States Patent and Trademark Office*